(12) United States Patent
Noda et al.

(10) Patent No.: US 10,600,738 B2
(45) Date of Patent: Mar. 24, 2020

(54) SEMICONDUCTOR DEVICE

(71) Applicant: Mitsubishi Electric Corporation, Tokyo (JP)

(72) Inventors: Manami Noda, Tokyo (JP); Kota Kimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/068,878

(22) PCT Filed: Jan. 21, 2016

(86) PCT No.: PCT/JP2016/051711
§ 371 (c)(1),
(2) Date: Jul. 9, 2018

(87) PCT Pub. No.: WO2017/126084
PCT Pub. Date: Jul. 27, 2017

(65) Prior Publication Data
US 2019/0027440 A1  Jan. 24, 2019

(51) Int. Cl.
*H01L 23/48* (2006.01)
*H01L 23/52* (2006.01)
(Continued)

(52) U.S. Cl.
CPC .......... *H01L 23/535* (2013.01); *H01L 23/291* (2013.01); *H01L 29/1608* (2013.01);
(Continued)

(58) Field of Classification Search
CPC . H01L 23/535; H01L 23/291; H01L 21/3205; H01L 21/768; H01L 29/417; H01L 29/42372; H01L 29/66; H01L 29/7397; H01L 29/7813; H01L 23/60–62; H01L 27/0248–0296; H01L 23/562–576
(Continued)

(56) References Cited

U.S. PATENT DOCUMENTS

2002/0036345 A1* 3/2002 Iseki ............... H01L 21/563
257/734
2004/0256730 A1 12/2004 Hirano et al.
(Continued)

FOREIGN PATENT DOCUMENTS

| JP | 2005-019447 A | 1/2005 |
| JP | 2011-066371 A | 3/2011 |
| JP | 2014-175313 A | 9/2014 |

OTHER PUBLICATIONS

International Search Report issued in PCT/JP2016/051711; dated Apr. 5, 2016.

*Primary Examiner* — Calvin Y Choi
(74) *Attorney, Agent, or Firm* — Studebaker & Brackett PC

(57) ABSTRACT

A gate electrode is formed in a trench formed in a semiconductor substrate. A gate interlayer insulating film is formed to cover the gate electrode and the like. A gate interconnection and an emitter electrode are formed in contact with the gate interlayer insulating film. A glass coating film and a polyimide film are formed to cover the gate interconnection and the emitter electrode. A solder layer is formed to cover the polyimide film. The gate interconnection and the emitter electrode are each formed of a tungsten film, for example.

10 Claims, 23 Drawing Sheets

(51) Int. Cl.
  *H01L 29/40*    (2006.01)
  *H01L 23/535*   (2006.01)
  *H01L 29/66*    (2006.01)
  *H01L 29/423*   (2006.01)
  *H01L 29/16*    (2006.01)
  *H01L 29/417*   (2006.01)
  *H01L 29/78*    (2006.01)
  *H01L 23/29*    (2006.01)
  *H01L 29/739*   (2006.01)

(52) U.S. Cl.
  CPC ...... *H01L 29/417* (2013.01); *H01L 29/41725* (2013.01); *H01L 29/42372* (2013.01); *H01L 29/66* (2013.01); *H01L 29/7397* (2013.01); *H01L 29/7813* (2013.01); *H01L 29/66734* (2013.01)

(58) Field of Classification Search
  USPC ........................................................ 257/762
  See application file for complete search history.

(56) References Cited

U.S. PATENT DOCUMENTS

2011/0042741 A1* 2/2011 Fukuoka ............. H01L 23/3192
                                                    257/330
2016/0005827 A1  1/2016 Nakano et al.

\* cited by examiner

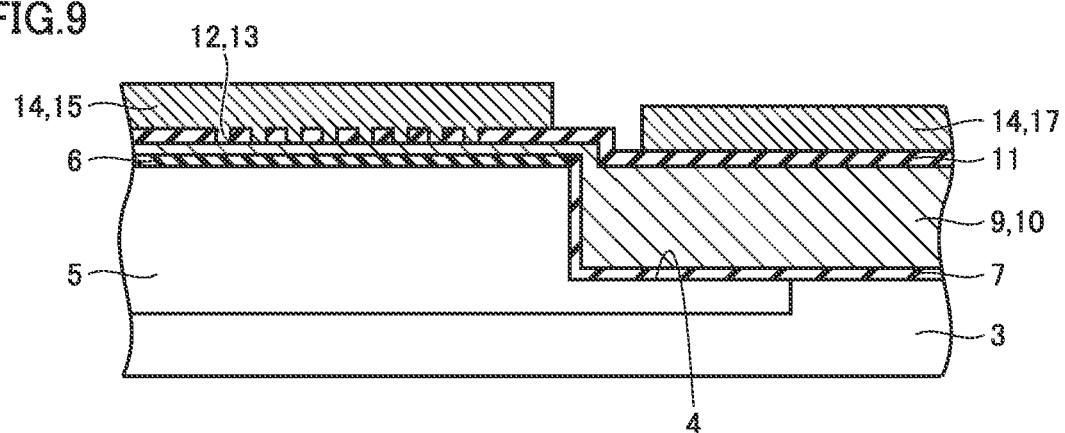
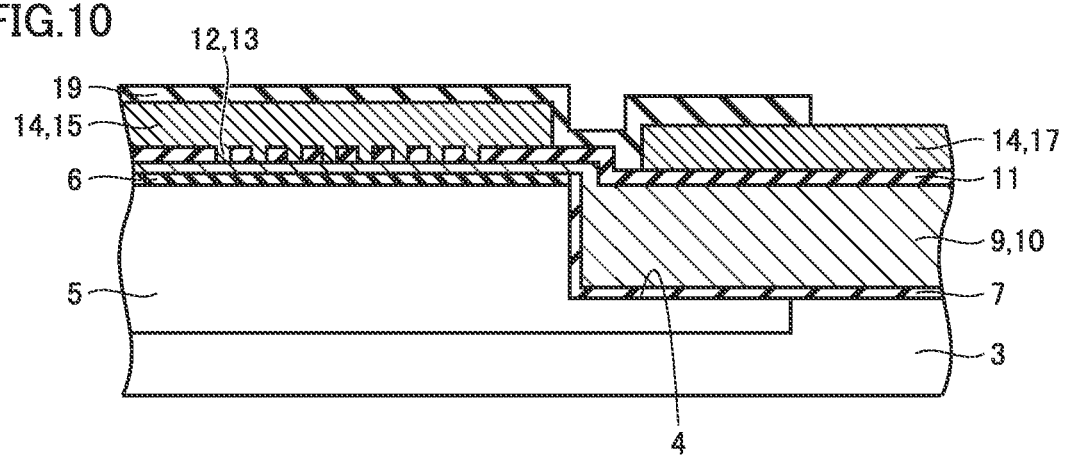

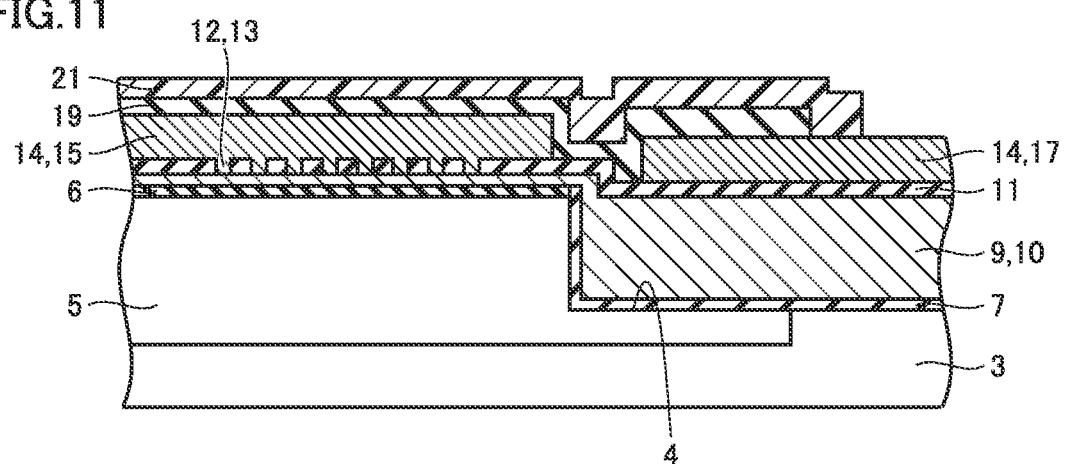
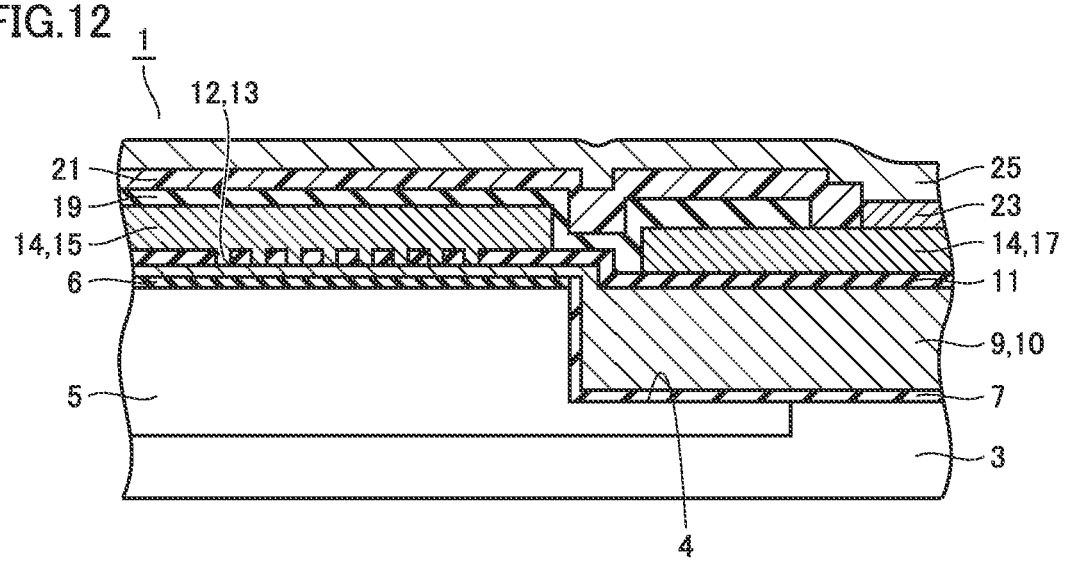

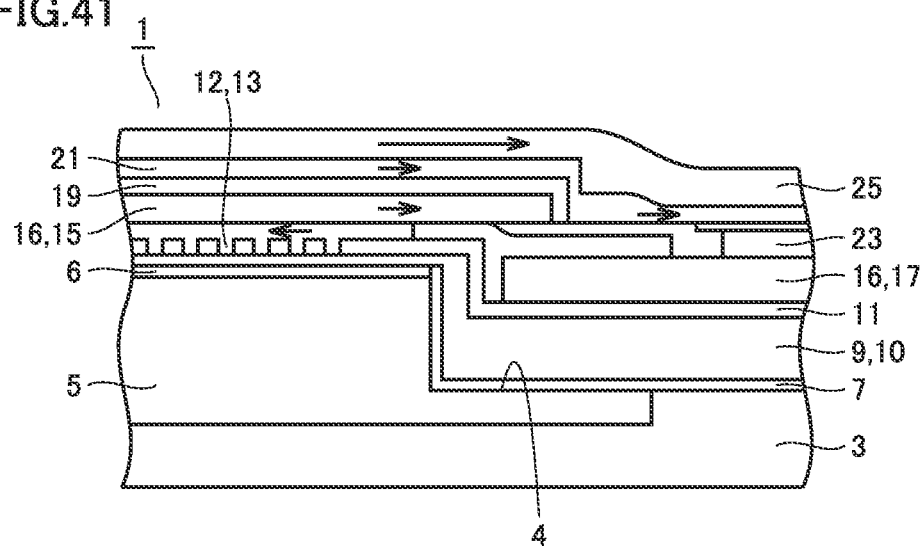
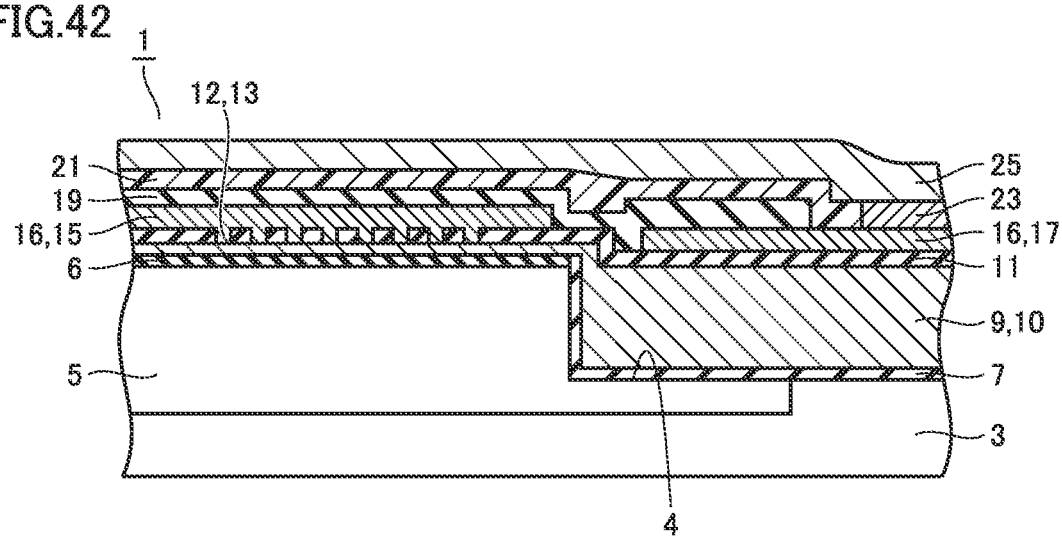

SEMICONDUCTOR DEVICE

TECHNICAL FIELD

The present invention relates to semiconductor devices, and more particularly to a power semiconductor device.

BACKGROUND ART

A semiconductor device having a trench gate structure is one form of a power semiconductor device. In a power semiconductor device, a semiconductor element such as a MOSFET (Metal Oxide Semiconductor Field Effect Transistor), an IGBT (Insulated Gate Bipolar Transistor), or a SiC-MOSFET is formed on a semiconductor substrate. An interconnection (for example, a gate interconnection and the like) and an electrode (for example, an emitter electrode and the like) for operating such a semiconductor element are formed in the semiconductor device.

The interconnection and the electrode are disposed at a distance from each other. A protective film is formed to cover a region located between the interconnection and the electrode. Further, a solder layer is formed to cover the protective film. PTD 1 and PTD 2 are examples of patent documents disclosing this type of semiconductor device.

CITATION LIST

Patent Documents

PTD 1: Japanese Patent Laying-Open No. 2014-175313
PTD 2: Japanese Patent Laying-Open No. 2005-019447

SUMMARY OF INVENTION

Technical Problem

In a conventional semiconductor device, a semiconductor element generates heat during ON operation, and the heat of the semiconductor element is released during OFF operation. A solder layer has a higher coefficient of thermal expansion than that of a protective film. Thus, in the semiconductor device, repeated expansion and contraction of the solder layer causes high stress to act on the protective film. When the stress acts on the protective film, relatively high stress also acts on the interconnection, the electrode or the like covered by the protective film.

When the relatively high stress acts on the interconnection, the electrode or the like, the interconnection disposed at a distance from the electrode may slide into contact with the electrode due to the stress, for example, causing electrical shorting between the interconnection and the electrode.

The present invention was made to solve the aforementioned problem, and has an object to provide a semiconductor device capable of preventing electrical shorting between electric conductors such as an interconnection and an electrode.

Solution to Problem

A first semiconductor device according to the present invention includes a semiconductor substrate, an insulating film, a first electric conductor, a second electric conductor, a protective film, and a solder layer. The insulating film is formed to cover the semiconductor substrate. The first electric conductor is formed on the insulating film. The second electric conductor is formed on the insulating film at a distance from the first electric conductor. The protective film is formed to cover the first electric conductor and the second electric conductor. The solder layer is formed to cover the protective film. The first electric conductor and the second electric conductor each have a Young's modulus of 300 GPa or more.

A second semiconductor device according to the present invention includes a semiconductor substrate, an insulating film, a first electric conductor, a second electric conductor, an embedded body, a protective film, and a solder layer. The insulating film is formed to cover the semiconductor substrate. The first electric conductor is formed on the insulating film. The second electric conductor is formed on the insulating film at a distance from the first electric conductor. The embedded body is formed to fill space between the first electric conductor and the second electric conductor. The protective film is formed to cover the first electric conductor, the second electric conductor and the embedded body. The solder layer is formed to cover the protective film.

A third semiconductor device according to the present invention includes a semiconductor substrate, an insulating film, a first electric conductor, a second electric conductor, a protective film, and a solder layer. The insulating film is formed to cover the semiconductor substrate. The first electric conductor is formed on the insulating film. The second electric conductor is formed on the insulating film at a distance from the first electric conductor. The protective film is formed to cover the first electric conductor and the second electric conductor. The solder layer is formed to cover the protective film. The first electric conductor and the second electric conductor are each provided with an inclined portion.

A fourth semiconductor device according to the present invention includes a semiconductor substrate, an insulating film, a first electric conductor, a second electric conductor, a protective film, and a solder layer. The insulating film is formed to cover the semiconductor substrate. The first electric conductor is formed on the insulating film. The second electric conductor is formed on the insulating film at a distance from the first electric conductor. The protective film is formed to cover the first electric conductor and the second electric conductor. The solder layer is formed to cover the protective film. An upper surface of the second electric conductor is located lower than a lower surface of the first electric conductor.

A fifth semiconductor device according to the present invention includes a semiconductor substrate, an insulating film, a first electric conductor, a second electric conductor, a protective film, and a solder layer. The insulating film is formed to cover the semiconductor substrate. The first electric conductor is formed on the insulating film. The second electric conductor is formed on the insulating film at a distance from the first electric conductor. The protective film is formed to cover the first electric conductor and the second electric conductor. The solder layer is formed to cover the protective film. The first electric conductor and the second electric conductor are each thinner than the solder layer.

Advantageous Effects of Invention

In accordance with the first semiconductor device according to the present invention, the first electric conductor and the second electric conductor each have a Young's modulus of 300 GPa or more. Thus, sliding of the first electric conductor or the second electric conductor can be suppressed, to prevent the first electric conductor and the second electric conductor from coming into contact with each other and being electrically shorted.

In accordance with the second semiconductor device according to the present invention, the embedded body is formed to fill the space between the first electric conductor and the second electric conductor. Thus, the stress acting on the first electric conductor or the second electric conductor can be relaxed, to suppress the sliding of the first electric conductor or the second electric conductor. As a result, the first electric conductor and the second electric conductor can be prevented from coming into contact with each other and being electrically shorted.

In accordance with the third semiconductor device according to the present invention, the first electric conductor and the second electric conductor are each provided with an inclined portion. Thus, the stress acting on the first electric conductor or the second electric conductor can be relaxed, to suppress the sliding of the first electric conductor or the second electric conductor. As a result, the first electric conductor and the second electric conductor can be prevented from coming into contact with each other and being electrically shorted.

In accordance with the fourth semiconductor device according to the present invention, the upper surface of the second electric conductor is located lower than the lower surface of the first electric conductor. Thus, even if the first electric conductor slides, the first electric conductor and the second electric conductor can be kept from coming into contact with each other. As a result, the first electric conductor and the second electric conductor can be prevented from being electrically shorted.

In accordance with the fifth semiconductor device according to the present invention, the first electric conductor and the second electric conductor are each thinner than the solder layer. Thus, the stress acting on the first electric conductor or the second electric conductor can be relaxed, to suppress the sliding of the first electric conductor or the second electric conductor. As a result, the first electric conductor and the second electric conductor can be prevented from coming into contact with each other and being electrically shorted.

BRIEF DESCRIPTION OF DRAWINGS

FIG. 9 is a partial sectional view showing a step performed after the step shown in FIG. 8, in the same embodiment.

FIG. 10 is a partial sectional view showing a step performed after the step shown in FIG. 9, in the same embodiment.

FIG. 11 is a partial sectional view showing a step performed after the step shown in FIG. 10, in the same embodiment.

FIG. 12 is a partial sectional view showing a step performed after the step shown in FIG. 11, in the same embodiment.

FIG. 41 is a partial sectional view illustrating stress acting on the semiconductor device, in the same embodiment.

FIG. 42 is a partial sectional view of a semiconductor device according to a sixth embodiment.

DESCRIPTION OF EMBODIMENTS

First Embodiment

Described here is an example of a semiconductor device including a gate interconnection and an emitter electrode which are made of a material harder than aluminum.

Figure 1:
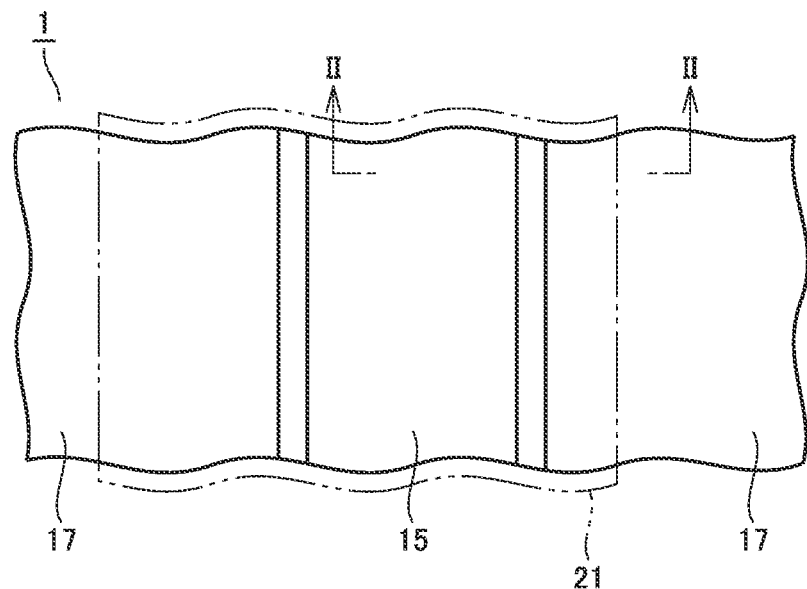
FIG. 1 is a partial plan view of a semiconductor device according to a first embodiment.
Figure 2:
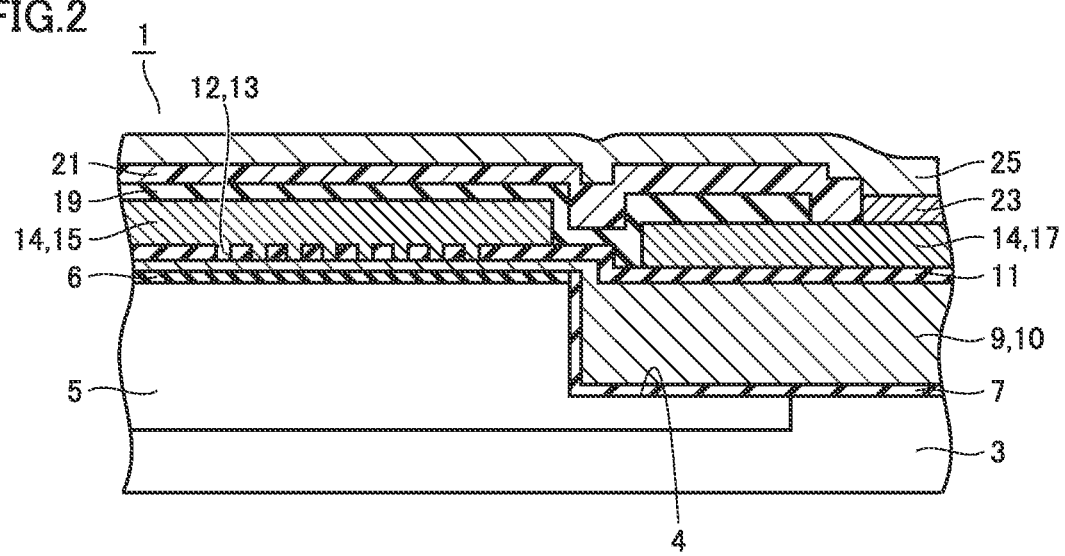
FIG. 2 is a partial sectional view along the sectional line II-II in FIG. 1, in the same embodiment.

As shown in FIGS. 1 and 2, in a semiconductor device 1, a P type layer 5 is formed to a predetermined depth from the surface of a predetermined region (gate pull-up portion) in a semiconductor substrate 3. A trench 4 of a predetermined depth is formed in a predetermined region (cell portion) in P type layer 5 and semiconductor substrate 3. A silicon oxide film 6 is formed to cover an upper surface of P type layer 5.

A gate insulating film 7 is formed on a bottom surface and a side surface of trench 4. A polysilicon film 9 is formed to cover silicon oxide film 6 and gate insulating film 7. A portion of polysilicon film 9 that is located in trench 4 serves as a gate electrode 10. Gate electrode 10 is, for example, a gate electrode of an IGBT as a semiconductor element.

A gate interlayer insulating film 11 is formed to cover polysilicon film 9. Contact holes 12 are formed to extend through gate interlayer insulating film 11. Contacts 13 (plugs) are formed in contact holes 12. A gate interconnection 15 is formed in contact with contacts 13. Gate interconnection 15 is electrically connected to gate electrode 10 through contacts 13.

An emitter electrode 17 is formed at a distance from gate interconnection 15. Emitter electrode 17 is, for example, an emitter electrode of an IGBT. As shown in FIG. 1, gate interconnection 15 is disposed such that it is sandwiched between one emitter electrode 17 and another emitter electrode. Here, gate interconnection 15 and emitter electrode 17 are each formed of a tungsten film 14, for example, as a material harder than aluminum.

A glass coating film 19 (silicon nitride film) as a highly insulating protective film is formed to cover gate interconnection 15 and the emitter electrode, as well as a region located between gate interconnection 15 and emitter electrode 17. Further, a polyimide film 21 as a semi-insulating protective film is formed to cover glass coating film 19. In addition, a metal film 23 is formed in contact with emitter electrode 17. A solder layer 25 is formed to cover polyimide film 21. Solder layer 25 is in contact with metal film 23. Semiconductor device 1 according to the first embodiment is configured as described above.

Figure 3:
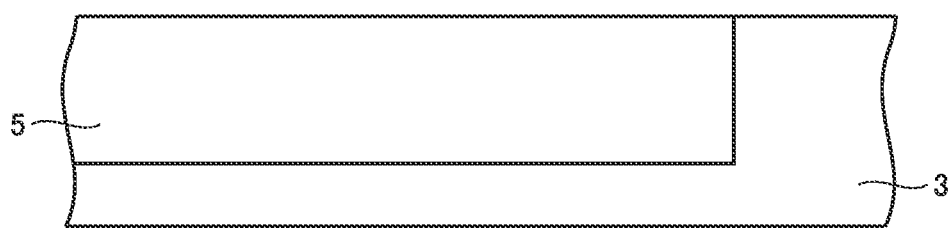
FIG. 3 is a partial sectional view showing a step of a method of manufacturing the semiconductor device, in the same embodiment.

An example of a method of manufacturing above-described semiconductor device 1 is described next. As shown in FIG. 3, a p type impurity is implanted into a predetermined region (gate pull-up portion) in semiconductor substrate 3, to form P type layer 5. P type layer 5 is formed to a predetermined depth from the surface of semiconductor substrate 3. Then, a silicon oxide film (not shown) is formed to cover P type layer 5 and semiconductor substrate 3.

Figure 4:
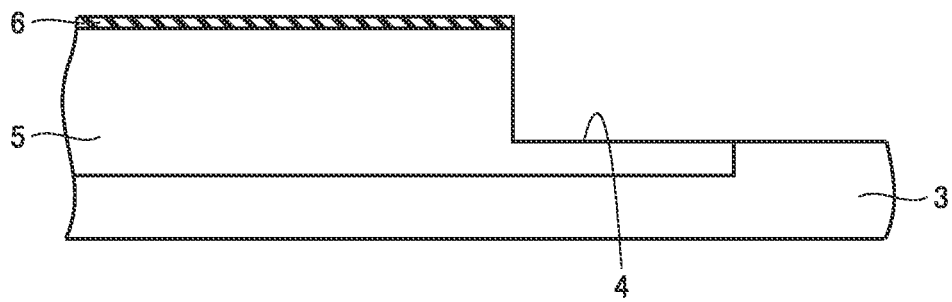
FIG. 4 is a partial sectional view showing a step performed after the step shown in FIG. 3, in the same embodiment.

Then, a predetermined photolithography process is performed to form a resist pattern (not shown) which exposes the silicon oxide film located in a region (cell portion) where the trench is to be formed, and which covers the other regions. Then, an etching process is performed on the exposed silicon oxide film and semiconductor substrate 3 with that resist pattern as an etching mask, to form trench 4 of a predetermined depth (see FIG. 4). The photoresist pattern is subsequently removed to expose remaining silicon oxide film 6, as shown in FIG. 4.

Figure 5:
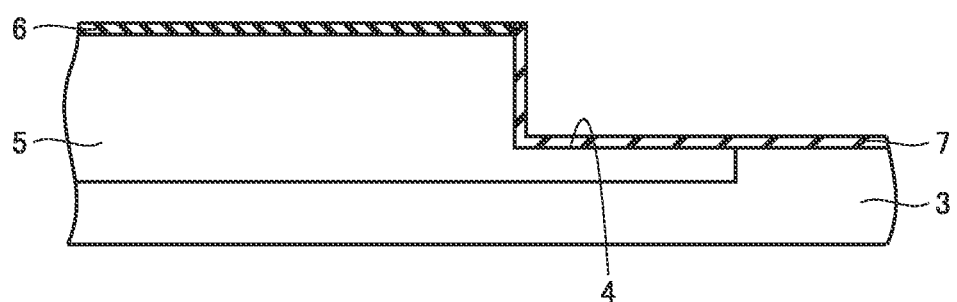
FIG. 5 is a partial sectional view showing a step performed after the step shown in FIG. 4, in the same embodiment.
Figure 6:
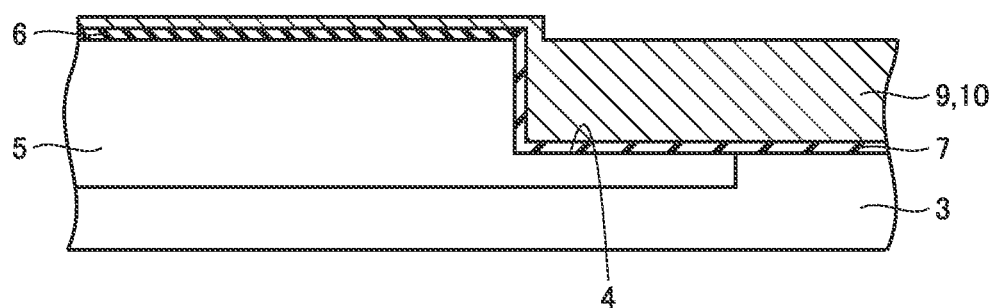
FIG. 6 is a partial sectional view showing a step performed after the step shown in FIG. 5, in the same embodiment.

Then, as shown in FIG. 5, a thermal oxidation process is performed, for example, to form gate insulating film 7 on the bottom surface and the side surface of trench 4. Then, as shown in FIG. 6, polysilicon film 9 is formed to cover gate insulating film 7 so as to fill trench 4, and to cover silicon oxide film 6. A portion of polysilicon film 9 that is formed in trench 4 serves as gate electrode 10.

Figure 7:
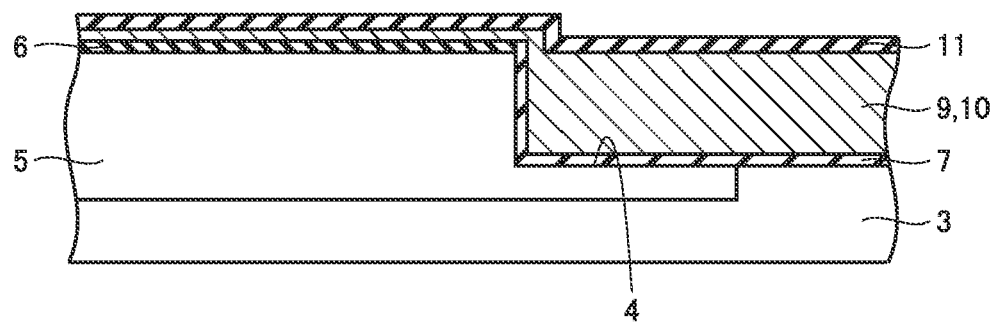
FIG. 7 is a partial sectional view showing a step performed after the step shown in FIG. 6, in the same embodiment.
Figure 8:
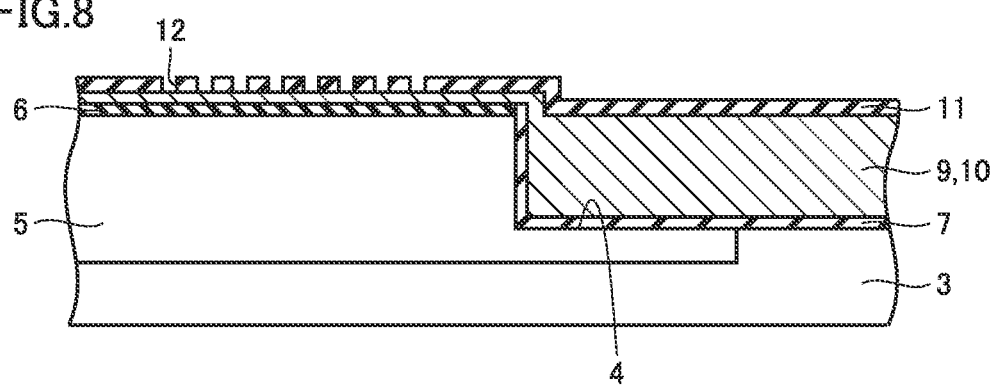
FIG. 8 is a partial sectional view showing a step performed after the step shown in FIG. 7, in the same embodiment.

Then, as shown in FIG. 7, gate interlayer insulating film 11 such as a silicon oxide film is formed to cover polysilicon film 9. Then, as shown in FIG. 8, contact holes 12 are formed in gate interlayer insulating film 11 to expose polysilicon film 9.

Then, a tungsten film (not shown) is formed by a sputtering process or a CVD (Chemical Vapor Deposition) process, for example, to cover gate interlayer insulating film 11. Then, a predetermined photolithography process and an etching process are performed to form gate interconnection 15 and emitter electrode 17, as shown in FIG. 9. Contacts 13 (plugs) are formed in contact holes 12. Gate interconnection 15 and emitter electrode 17 are each formed of tungsten film 14 which is harder than aluminum.

Then, a silicon nitride film (not shown) is formed to cover gate interconnection 15 and emitter electrode 17. Then, a predetermined photolithography process and an etching process are performed to form glass coating film 19 as a highly insulating protective film, as shown in FIG. 10. Glass coating film 19 is formed in such a manner as to cover the region located between gate interconnection 15 and emitter electrode 17, and expose a portion of emitter electrode 17.

Then, a polyimide film (not shown) is formed to cover glass coating film 19 and exposed emitter electrode 17. Then, a predetermined photolithography process and an etching process are performed to form polyimide film 21 as a semi-insulating protective film, as shown in FIG. 11. Polyimide film 21 is formed in such a manner as to cover glass coating film 19 and expose a portion of emitter electrode 17.

Then, as shown in FIG. 12, metal film 23 is formed in contact with the exposed portion of emitter electrode 17. Then, solder layer 25 is formed to cover polyimide film 21. Solder layer 25 is in contact with metal film 23. A main part of semiconductor device 1 is thus completed.

In semiconductor device 1 described above, since gate interconnection 15 and emitter electrode 17 are each formed of tungsten film 14, sliding of gate interconnection 15 in a lateral direction caused by expansion and contraction of solder layer 25 can be suppressed. This will be described in comparison with a semiconductor device according to a comparative example.

Figure 13:
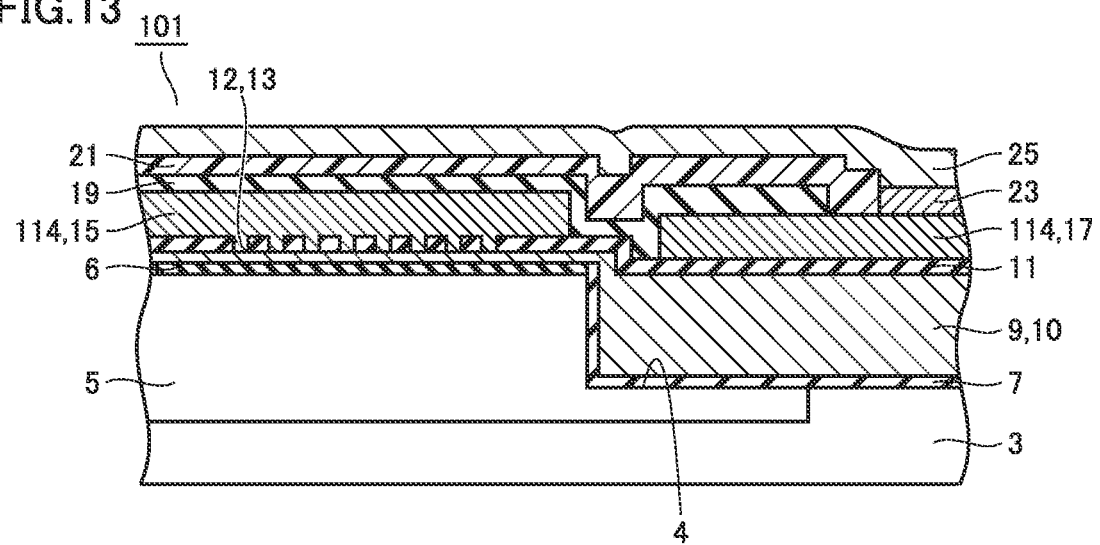
FIG. 13 is a partial sectional view of a semiconductor device according to a comparative example.

As shown in FIG. 13, in a semiconductor device 101 according to a comparative example, gate interconnection 15 and emitter electrode 17 are each formed of an aluminum film 114. Since the configuration is otherwise similar to that of semiconductor device 1 shown in FIG. 2, the same components are designated by the same characters and description thereof will not be repeated unless needed.

Figure 14:
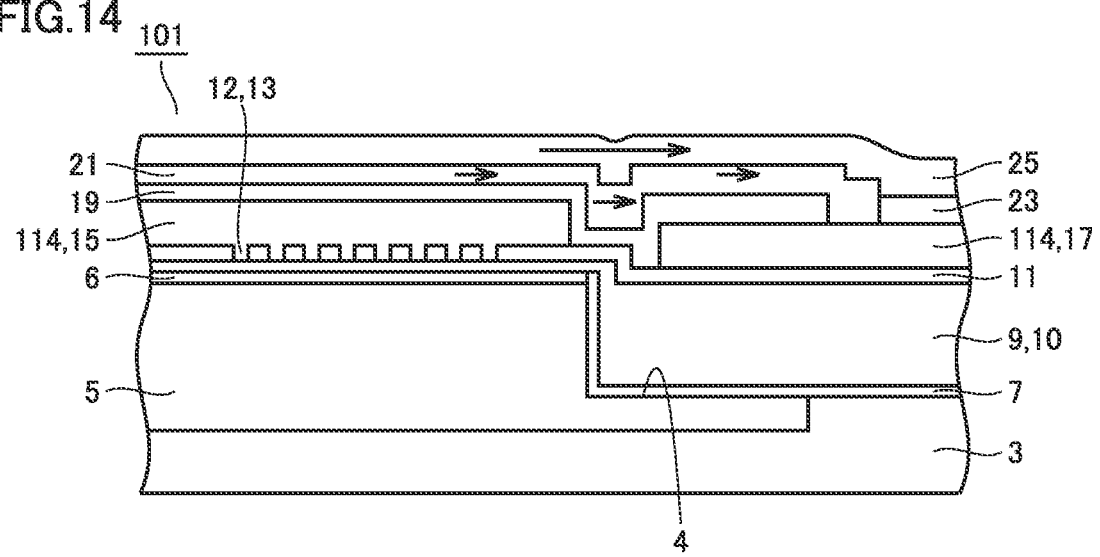
FIG. 14 is a first partial sectional view illustrating stress acting on the semiconductor device according to the comparative example.

In semiconductor device 101, solder layer 25 expands and contracts repeatedly with ON operation and OFF operation of semiconductor device 101 (semiconductor element). Solder layer 25 has a higher coefficient of thermal expansion than that of polyimide film 21 and the like. Thus, the repeated expansion and contraction of solder layer 25 causes high stress to act on polyimide film 21 and the like, as shown in FIG. 14 (see arrows). When the stress acts on polyimide film 21 and the like, relatively high stress also acts on gate interconnection 15 covered by polyimide film 21 and the like and extending with a predetermined width.

Figure 15:
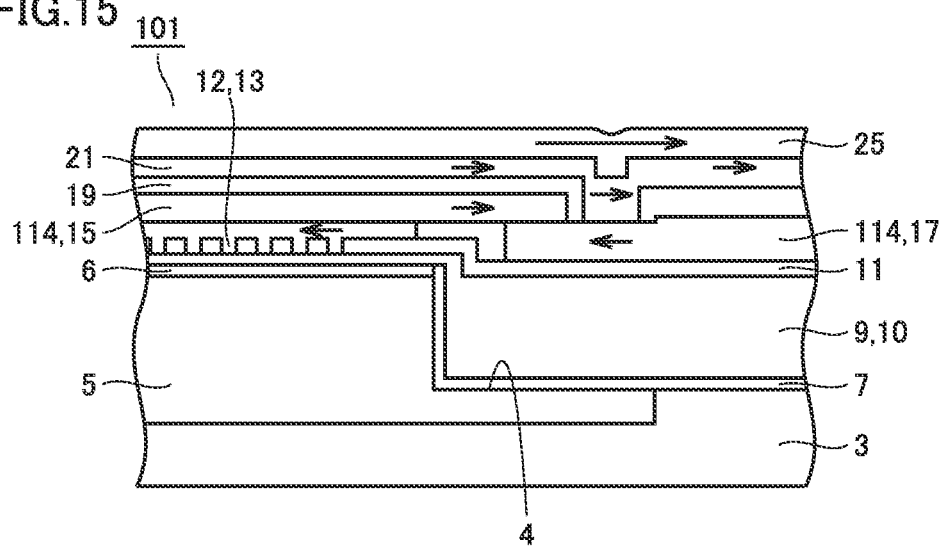
FIG. 15 is a second partial sectional view illustrating stress acting on the semiconductor device according to the comparative example.

In semiconductor device 101 according to the comparative example, gate interconnection 15 is made of aluminum which is relatively soft. Thus, as shown in FIG. 15, gate interconnection 15 slides in the lateral direction due to the stress acting on gate interconnection 15. More specifically, a portion of gate interconnection 15 that is located above an upper surface of glass coating film 19 covering the region located between gate interconnection 15 and emitter electrode 17 slides in the lateral direction, while a portion of gate interconnection 15 that is located below that upper surface remains. As a result, gate interconnection 15 may come into contact with emitter electrode 17 to cause electrical shorting.

Figure 16:
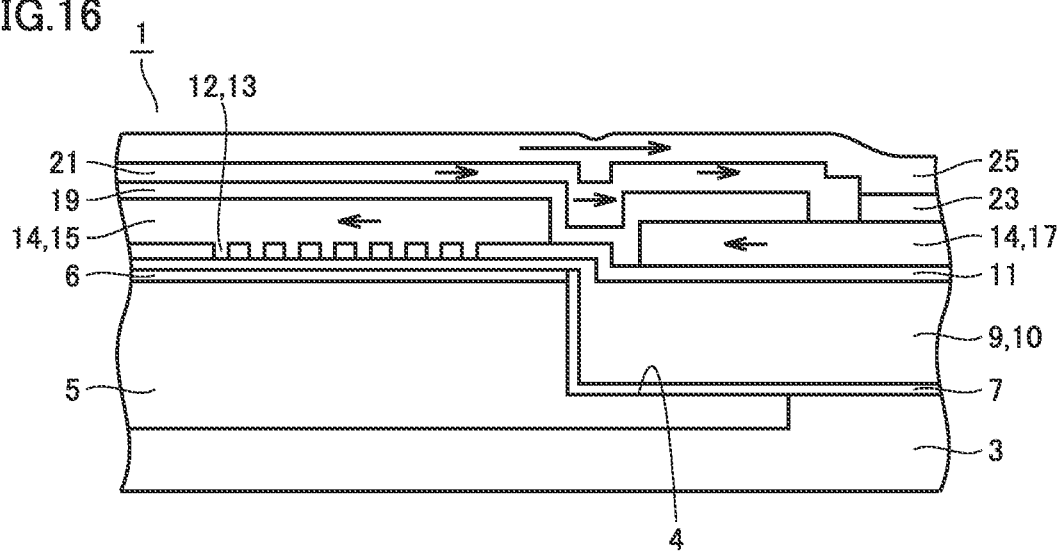
FIG. 16 is a partial sectional view illustrating stress acting on the semiconductor device, in the same embodiment.

In contrast with semiconductor device 101 according to the comparative example, in semiconductor device 1 according to the first embodiment, gate interconnection 15 and emitter electrode 17 are each formed of tungsten film 14 which is harder than aluminum. Accordingly, as shown in FIG. 16, the stress acting on gate interconnection 15 can be opposed, to suppress the sliding of gate interconnection 15 in the lateral direction. As a result, gate interconnection 15 can be prevented from coming into contact with emitter electrode 17 to cause electrical shorting.

Tungsten film 14 has been described here as an example of a material harder than aluminum. The inventors' evaluation revealed that a material having a predetermined Young's modulus may be employed as a material for gate interconnection 15 and emitter electrode 17. This is described next.

First, it was found that gate interconnection 15 made of aluminum slides approximately 45 μm due to the stress. Given the fact that aluminum has a Young's modulus of 68.3 Gpa ($68.3 \times 10^9$ N/m$^2$) as well as this sliding distance, it is estimated that a stress of approximately 3000 N/mm is acting on gate interconnection 15.

The space between gate interconnection 15 and emitter electrode 17 is approximately 10 μm. Here, it is considered that, even if gate interconnection 15 slides, electrical shorting is prevented when the sliding distance is shorter than this space. It is then considered that electrical shorting is prevented with gate interconnection 15 and the like made of a material having a Young's modulus of 300 Gpa ($300 \times 10^9$ N/m$^2$) or more.

Tungsten film 14 (W) cited in the first embodiment has a Young's modulus of 345 Gpa ($345 \times 10^9$ N/m$^2$), which satisfies the aforementioned requirement. Examples of the material for gate interconnection 15 and the like include, in addition to the tungsten, copper-tungsten (10Cu—W), copper-tungsten (15Cu—W), tungsten-nickel-copper (W-1.8Ni-1.2Cu) and tungsten-nickel-copper (W-3Ni-2Cu).

The copper-tungsten (10Cu—W) has a Young's modulus of 320 Gpa ($320 \times 10^9$ N/m$^2$). The copper-tungsten (15Cu—W) has a Young's modulus of 310 Gpa ($310 \times 10^9$ N/m$^2$). The tungsten-nickel-copper (W-1.8Ni-1.2Cu) also has a Young's modulus of 310 Gpa ($310 \times 10^9$ N/m$^2$). The tungsten-nickel-copper (W-3Ni-2Cu) also has a Young's modulus of 310 Gpa ($310 \times 10^9$ N/m$^2$). All of these materials have a Young's modulus higher than 300 Gpa ($300 \times 10^9$ N/m$^2$), which satisfies the aforementioned requirement.

By applying the aforementioned materials as a material for gate interconnection 15 and emitter electrode 17, electrical shorting between gate interconnection 15 and emitter electrode 17 can be suppressed. Although gate interconnection 15 and emitter electrode 17 have been described by way of example in semiconductor device 1 according to the first embodiment, the aforementioned materials can be applied to interconnections other than gate interconnection 15 and electrodes other than emitter electrode 17. By applying the aforementioned materials, electrical shorting between an interconnection and an electrode, electrical shorting between interconnections, or electrical shorting between electrodes can be suppressed.

Second Embodiment

Described here is an example of a semiconductor device including a dummy embedded electrode between a gate interconnection and an emitter electrode.

Figure 17:
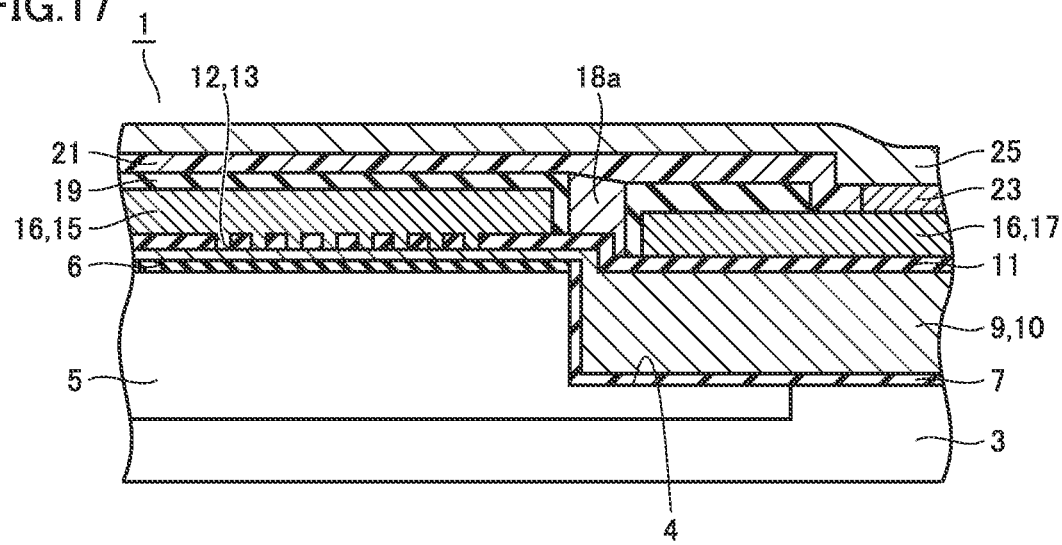
FIG. 17 is a partial sectional view of a semiconductor device according to a second embodiment.

As shown in FIG. 17, in semiconductor device 1, gate interconnection 15 is formed in contact with gate interlayer insulating film 11. Emitter electrode 17 is formed, at a distance from gate interconnection 15, in contact with gate interlayer insulating film 11. Here, gate interconnection 15 and emitter electrode 17 are each formed of an aluminum film 16, for example.

Glass coating film 19 is formed to cover a side surface and an upper surface of gate interconnection 15. Glass coating film 19 is also formed to cover a side surface and a portion of an upper surface of emitter electrode 17. A dummy embedded electrode 18a is formed to fill a recess (step) located between gate interconnection 15 and emitter electrode 17. Here, dummy embedded electrode 18a is formed of an aluminum film, for example.

Glass coating film 19 is formed to cover embedded electrode 18a, gate interconnection 15 and emitter electrode 17. Further, polyimide film 21 is formed to cover glass coating film 19. Solder layer 25 is formed to cover polyimide film 21 and the like. Since the configuration is otherwise similar to that of semiconductor device 1 shown in FIG. 2, the same components are designated by the same characters and description thereof will not be repeated unless needed.

An example of a method of manufacturing above-described semiconductor device 1 is described next. First, a gate interconnection and an emitter electrode each formed of an aluminum film are formed through steps similar to those shown in FIGS. 3 to 8. Then, a silicon nitride film (not shown) is formed to cover the gate interconnection and the emitter electrode.

Figure 18:
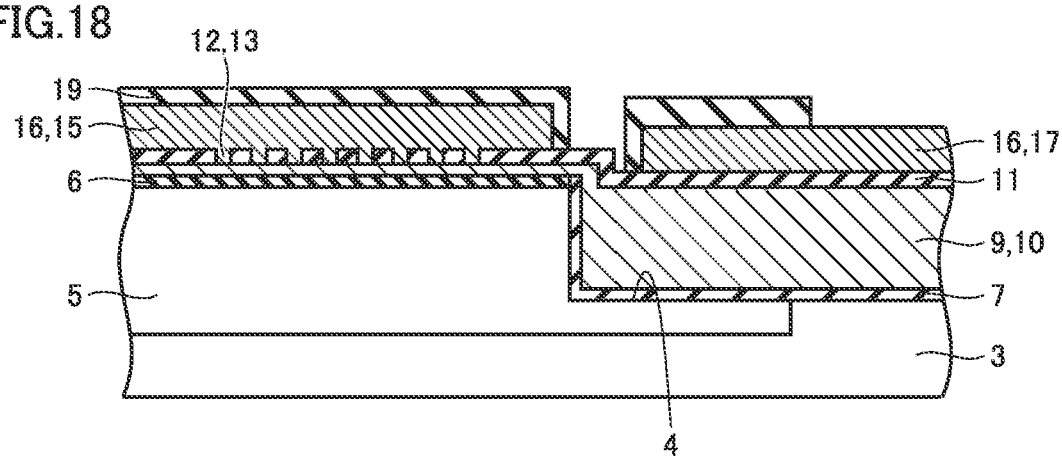
FIG. 18 is a partial sectional view showing a step of a method of manufacturing the semiconductor device, in the same embodiment.

Then, a predetermined photolithography process and an etching process are performed to form glass coating film 19, as shown in FIG. 18. Glass coating film 19 is formed to cover the side surface and the upper surface of gate interconnection 15, and formed to cover the side surface and a portion of the upper surface of emitter electrode 17. In the region (recess or step) located between gate interconnection 15 and emitter electrode 17, the silicon nitride film has been removed to expose gate interlayer insulating film 11.

Figure 19:
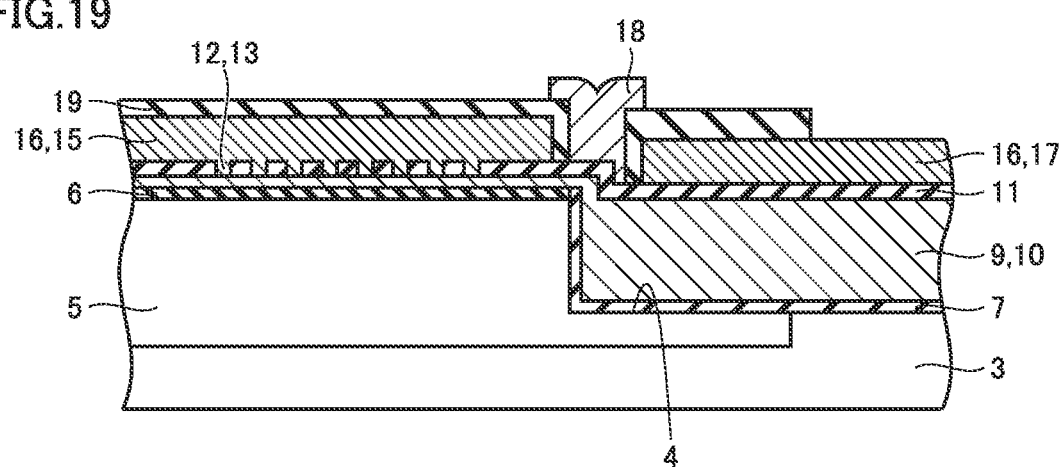
FIG. 19 is a partial sectional view showing a step performed after the step shown in FIG. 18, in the same embodiment.

Then, a conductive film (not shown) formed of an aluminum film, for example, is formed to cover the glass coating film in such a manner as to fill the region (recess or step) located between gate interconnection 15 and emitter electrode 17. Then, a predetermined photolithography process and an etching process are performed to leave a portion of the conductive film (conductive film 18) embedded in the region (recess or step) located between gate interconnection 15 and emitter electrode 17 and remove a portion of the conductive film located in the other regions, as shown in FIG. 19.

Figure 20:
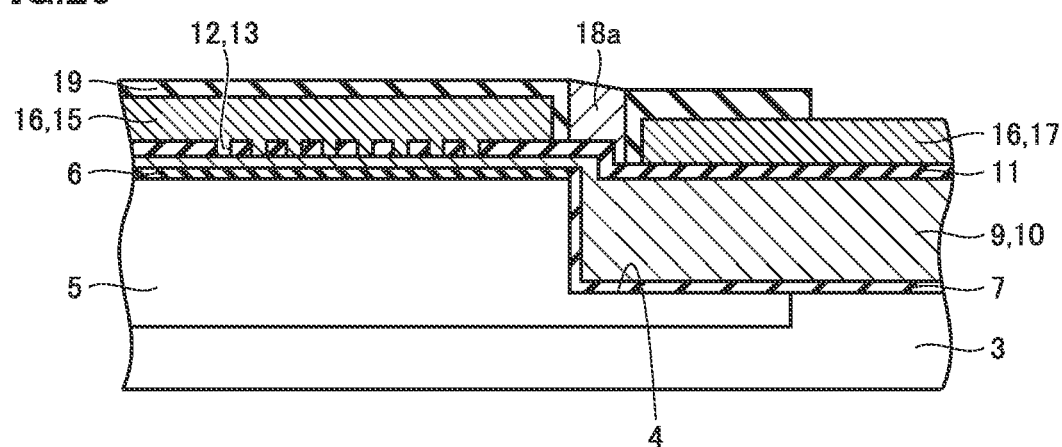
FIG. 20 is a partial sectional view showing a step performed after the step shown in FIG. 19, in the same embodiment.

Then, as shown in FIG. 20, an etching process is performed on remaining conductive film 18 to match an upper surface of conductive film 18 to the position of the upper surface of glass coating film 19, to thereby form dummy embedded electrode 18a.

Figure 21:
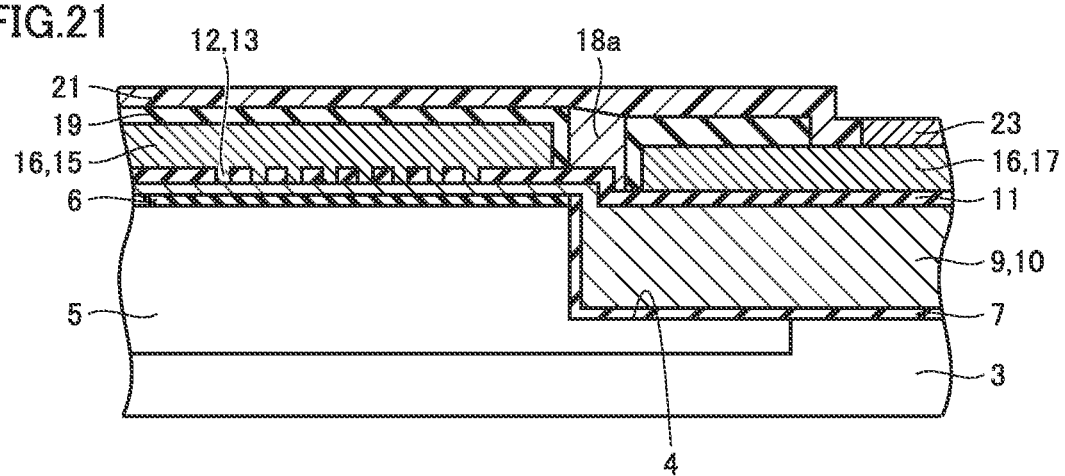
FIG. 21 is a partial sectional view showing a step performed after the step shown in FIG. 20, in the same embodiment.

Then, as shown in FIG. 21, polyimide film 21 is formed to cover glass coating film 19 and embedded electrode 18a through a step similar to that shown in FIG. 11. Then, metal film 23 is formed in contact with emitter electrode 17. Subsequently, solder layer 25 is formed to cover polyimide film 21, to complete a main part of semiconductor device 1 shown in FIG. 17.

Figure 22:
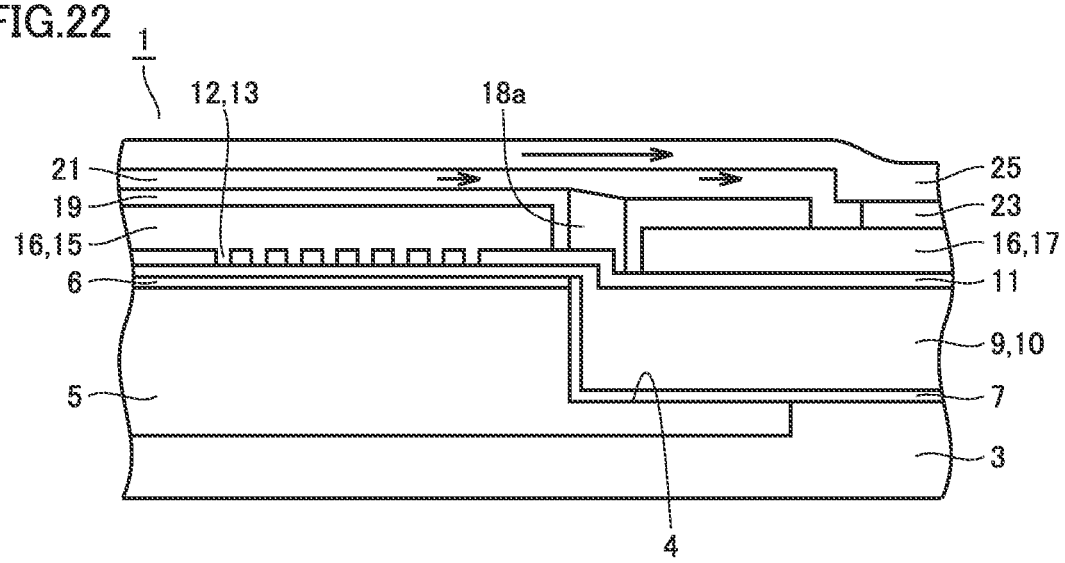
FIG. 22 is a partial sectional view illustrating stress acting on the semiconductor device, in the same embodiment.

In semiconductor device 1 described above, dummy embedded electrode 18a is formed to fill the region (recess or step) located between gate interconnection 15 and emitter electrode 17. Thus, polyimide film 21 will not be formed in the recess or the step between gate interconnection 15 and emitter electrode 17. Accordingly, as shown in FIG. 22, the stress acting on polyimide film 21 with the expansion and contraction of solder layer 25 can be kept from reaching gate interconnection 15 and the like. As a result, gate interconnection 15 can be prevented from coming into contact with emitter electrode 17 to cause electrical shorting.

In semiconductor device 1 described above, aluminum (Al) was cited as an example of the material for embedded electrode 18a. The material for embedded electrode 18a is not limited to aluminum, but tungsten (W) or titanium (Ti) may be used, for example.

Third Embodiment

Described here is an example of a semiconductor device including a gate interconnection and an emitter electrode each provided with an inclined portion.

Figure 23:
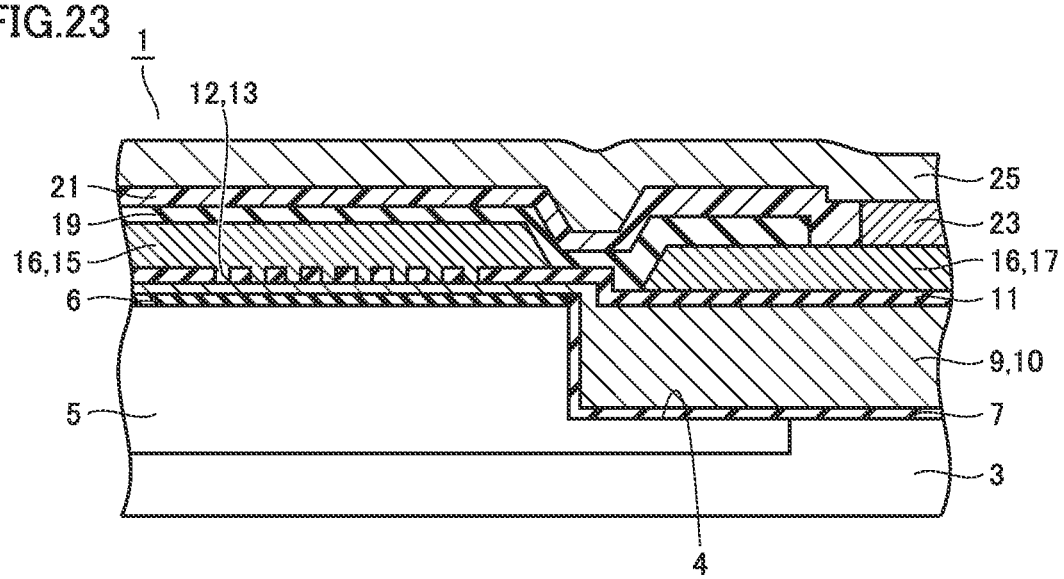
FIG. 23 is a partial sectional view of a semiconductor device according to a third embodiment.

As shown in FIG. 23, in semiconductor device 1, gate interconnection 15 is formed in contact with gate interlayer insulating film 11. Emitter electrode 17 is formed, at a distance from gate interconnection 15, in contact with gate interlayer insulating film 11. Each of gate interconnection 15 and emitter electrode 17 is provided with an inclined portion. Here, they are provided with a tapered inclined portion. Gate interconnection 15 and emitter electrode 17 are each formed of aluminum film 16, for example.

Glass coating film 19 is formed to cover gate interconnection 15 and the emitter electrode, as well as the region located between gate interconnection 15 and emitter electrode 17. Further, polyimide film 21 is formed to cover glass coating film 19. Solder layer 25 is formed to cover polyimide film 21 and the like. Since the configuration is otherwise similar to that of semiconductor device 1 shown in FIG. 2, the same components are designated by the same characters and description thereof will not be repeated unless needed.

Figure 24:
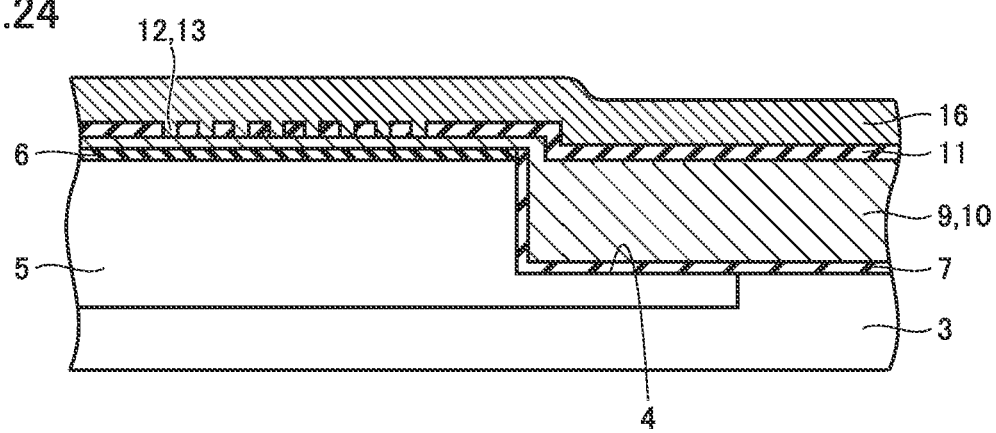
FIG. 24 is a partial sectional view showing a step of a method of manufacturing the semiconductor device, in the same embodiment.

An example of a method of manufacturing above-described semiconductor device 1 is described next. First, as shown in FIG. 24, aluminum film 16 is formed by a sputtering process, for example, to cover gate interlayer insulating film 11, through steps similar to those shown in FIGS. 3 to 8.

Figure 25:
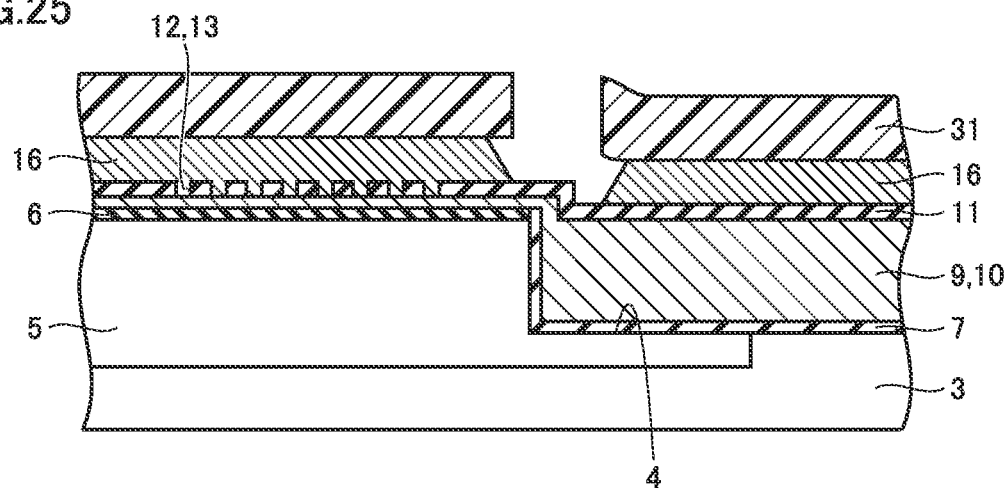
FIG. 25 is a partial sectional view showing a step performed after the step shown in FIG. 24, in the same embodiment.

Then, as shown in FIG. 25, a predetermined photolithography process is performed to form a photoresist pattern 31 for patterning the gate interconnection and the emitter electrode. Photoresist pattern 31 is formed to expose a portion of aluminum film 16 that covers a region in the vicinity of the boundary between gate electrode 10 and P type layer 5.

Figure 26:
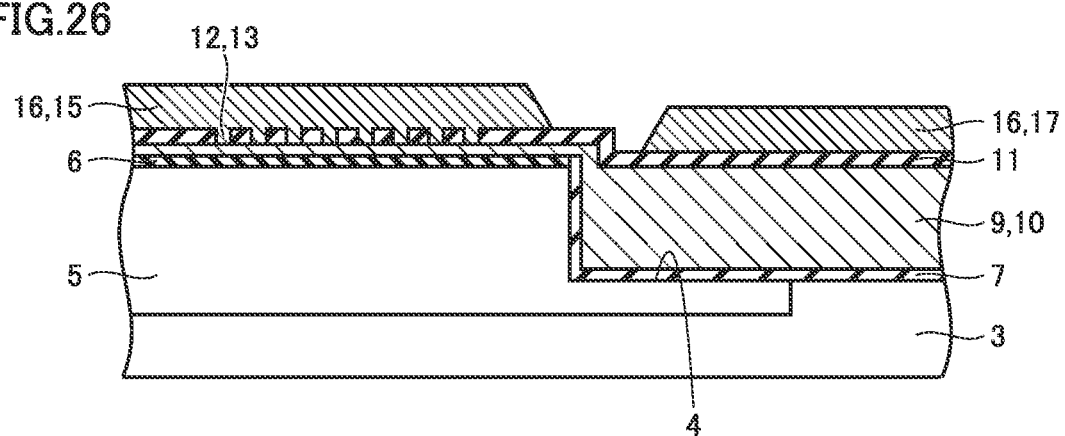
FIG. 26 is a partial sectional view showing a step performed after the step shown in FIG. 25, in the same embodiment.

Then, a wet etching process is performed on exposed aluminum film 16, with photoresist pattern 31 as an etching mask. Here, aluminum film 16 is isotropically etched, whereby a tapered inclined portion is formed on a longitudinal surface (side surface) of the aluminum film. Photoresist pattern 31 is subsequently removed to expose gate interconnection 15 and emitter electrode 17 each provided with the tapered inclined portion, as shown in FIG. 26.

Figure 27:
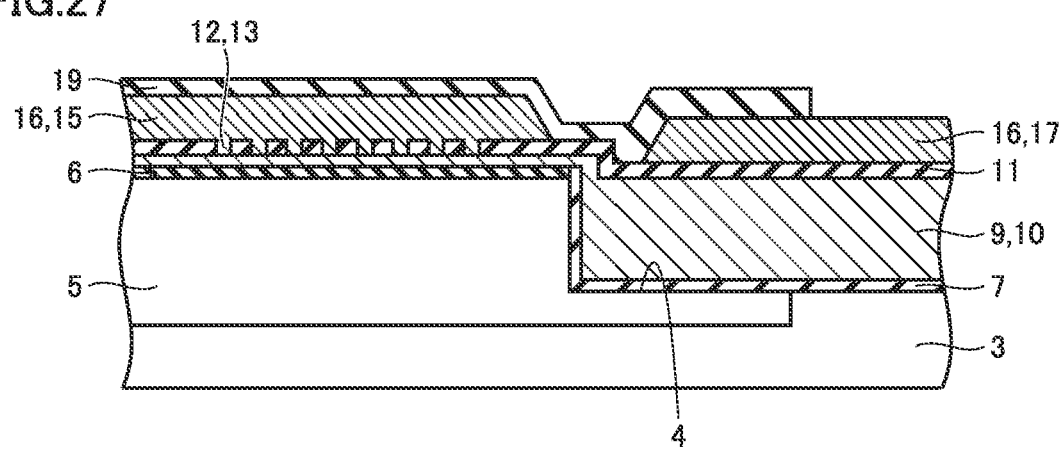
FIG. 27 is a partial sectional view showing a step performed after the step shown in FIG. 26, in the same embodiment.
Figure 28:
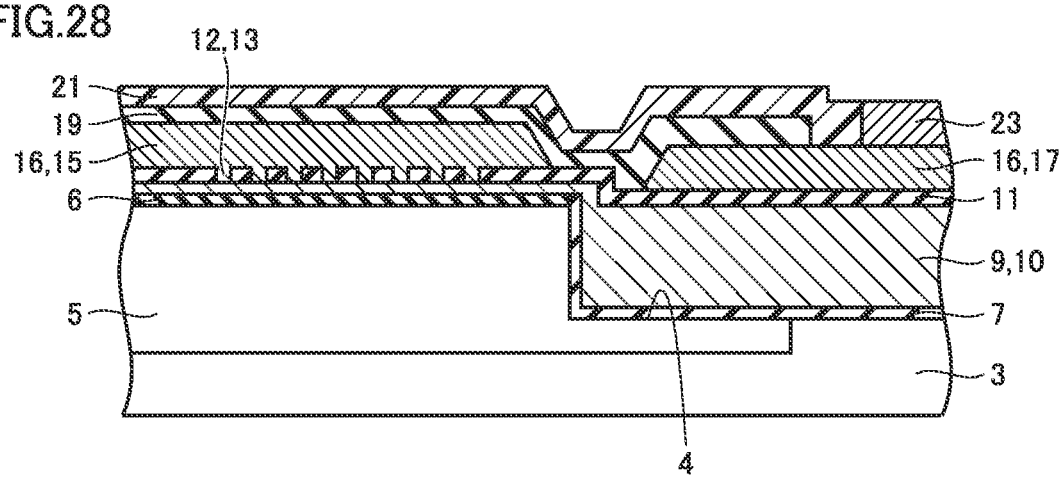
FIG. 28 is a partial sectional view showing a step performed after the step shown in FIG. 27, in the same embodiment.

Then, as shown in FIG. 27, glass coating film 19 is formed through a step similar to that shown in FIG. 10. Then, as shown in FIG. 28, polyimide film 21 is formed to cover glass coating film 19 through a step similar to that shown in FIG. 11. Then, metal film 23 is formed in contact with emitter electrode 17. Solder layer 25 is subsequently formed to cover polyimide film 21, to complete a main part of semiconductor device 1 shown in FIG. 23.

Figure 29:
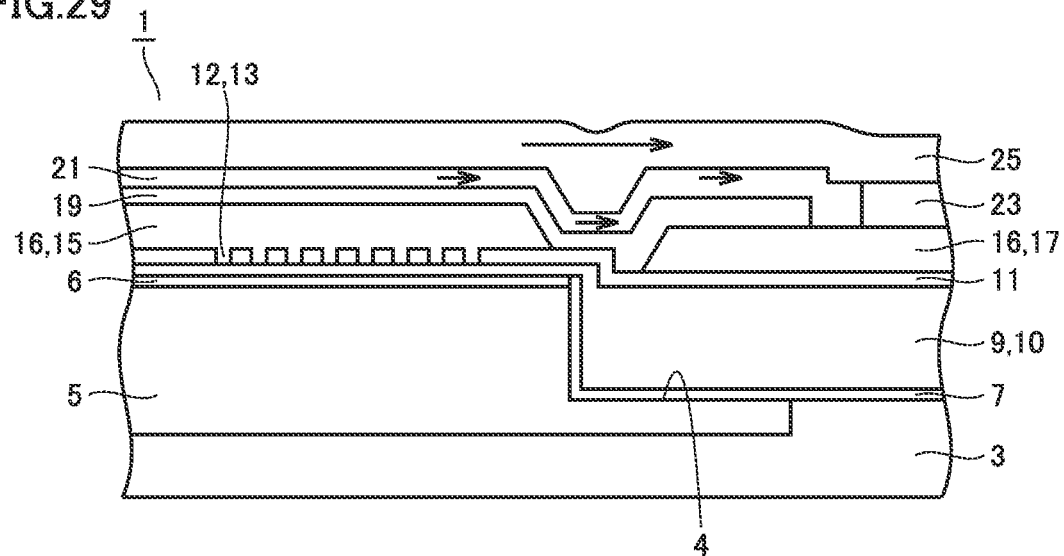
FIG. 29 is a partial sectional view illustrating stress acting on the semiconductor device, in the same embodiment.

In semiconductor device 1 described above, each of gate interconnection 15 and emitter electrode 17 is provided with the tapered inclined portion. Thus, the stress acting on polyimide film 21 with the expansion and contraction of solder layer 25 is partly released by the inclined portions of gate interconnection 15 and the like. The stress reaching gate interconnection 15 and the like is thereby weakened. As a result, as shown in FIG. 29, the sliding of gate interconnection 15 in the lateral direction can be suppressed, to prevent gate interconnection 15 from coming into contact with emitter electrode 17 to cause electrical shorting.

Fourth Embodiment

Described here is another example of a semiconductor device including a gate interconnection and an emitter electrode each provided with an inclined portion.

Figure 30:
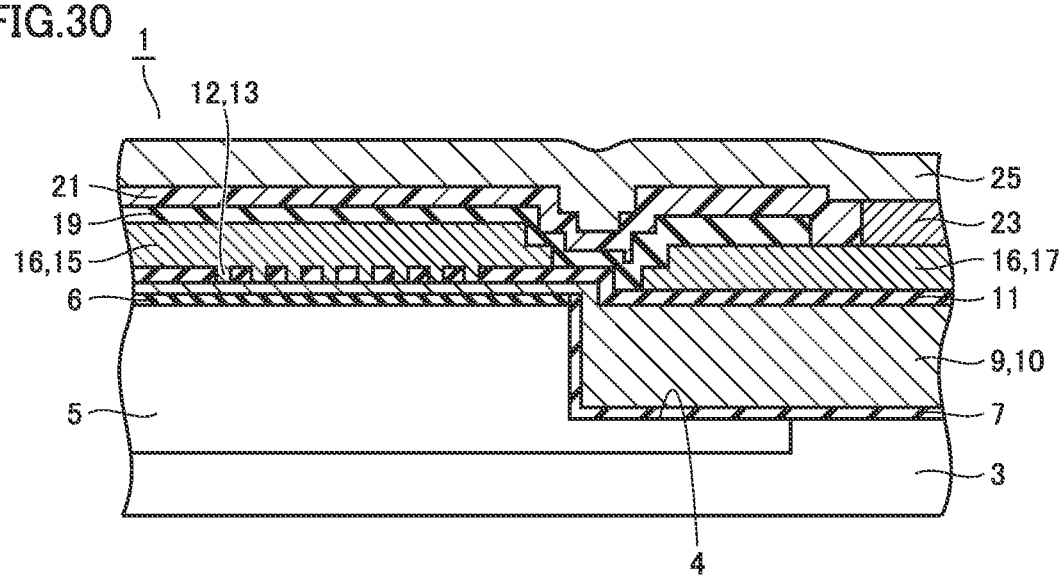
FIG. 30 is a partial sectional view of a semiconductor device according to a fourth embodiment.

As shown in FIG. 30, in semiconductor device 1, gate interconnection 15 is formed in contact with gate interlayer insulating film 11. Emitter electrode 17 is formed, at a distance from gate interconnection 15, in contact with gate interlayer insulating film 11. Each of gate interconnection 15 and emitter electrode 17 is provided with an inclined portion. Here, they are provided with a stepped inclined portion.

Gate interconnection 15 and emitter electrode 17 are each formed of aluminum film 16, for example.

Glass coating film 19 is formed to cover gate interconnection 15 and the emitter electrode, as well as the region located between gate interconnection 15 and emitter electrode 17. Further, polyimide film 21 is formed to cover glass coating film 19. Solder layer 25 is formed to cover polyimide film 21 and the like. Since the configuration is otherwise similar to that of semiconductor device 1 shown in FIG. 2, the same components are designated by the same characters and description thereof will not be repeated unless needed.

Figure 31:
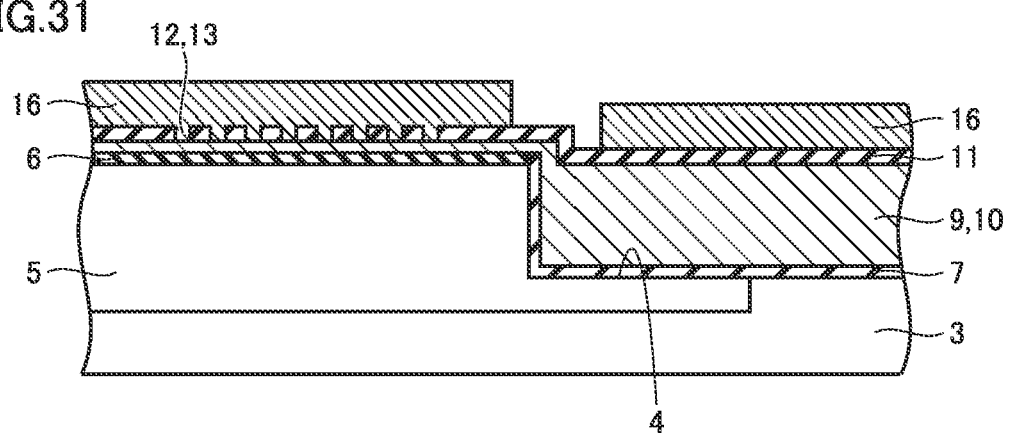
FIG. 31 is a partial sectional view showing a step of a method of manufacturing the semiconductor device, in the same embodiment.

An example of a method of manufacturing above-described semiconductor device 1 is described next. First, as shown in FIG. 31, a pattern of aluminum film 16 is formed through steps similar to those shown in FIGS. 3 to 9.

Figure 32:
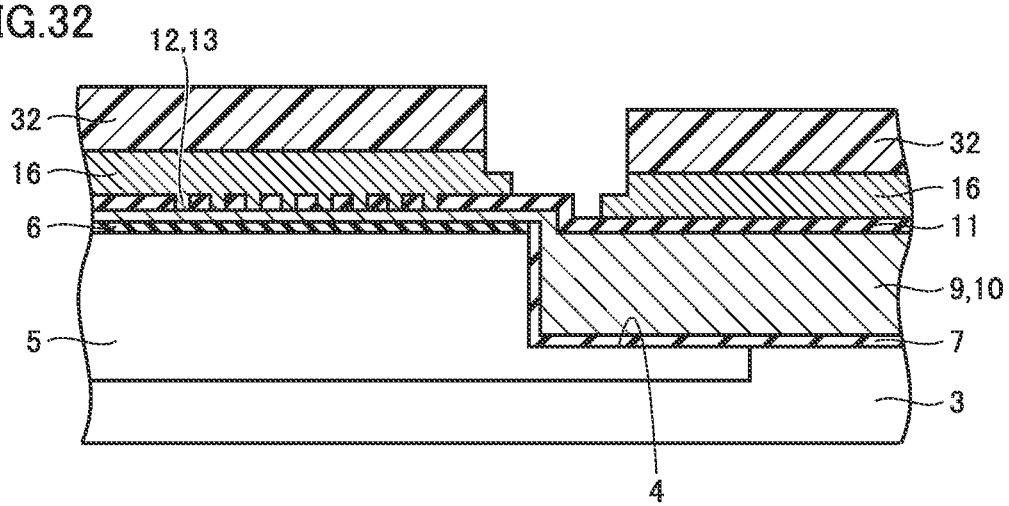
FIG. 32 is a partial sectional view showing a step performed after the step shown in FIG. 31, in the same embodiment.

Then, as shown in FIG. 32, a predetermined photolithography process is performed to form a photoresist pattern 32. Photoresist pattern 32 is formed to have a size smaller than that of the pattern of aluminum film 16. Then, an anisotropic etching process is performed on exposed aluminum film 16, with photoresist pattern 32 as an etching mask, to form a stepped inclined portion on a side wall of aluminum film 16. Here, an amount of etching of aluminum film 16 is controlled by an etching time. Photoresist pattern 32 is subsequently removed.

Figure 33:
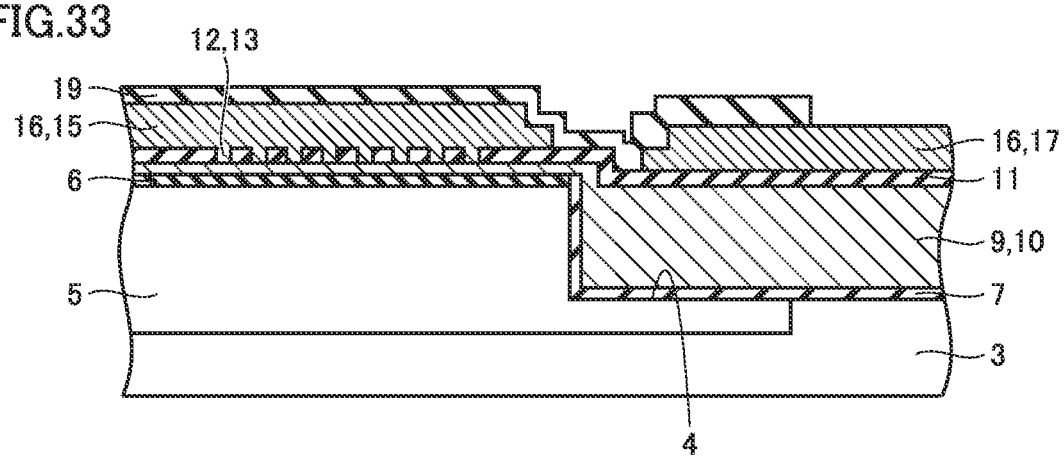
FIG. 33 is a partial sectional view showing a step performed after the step shown in FIG. 32, in the same embodiment.
Figure 34:
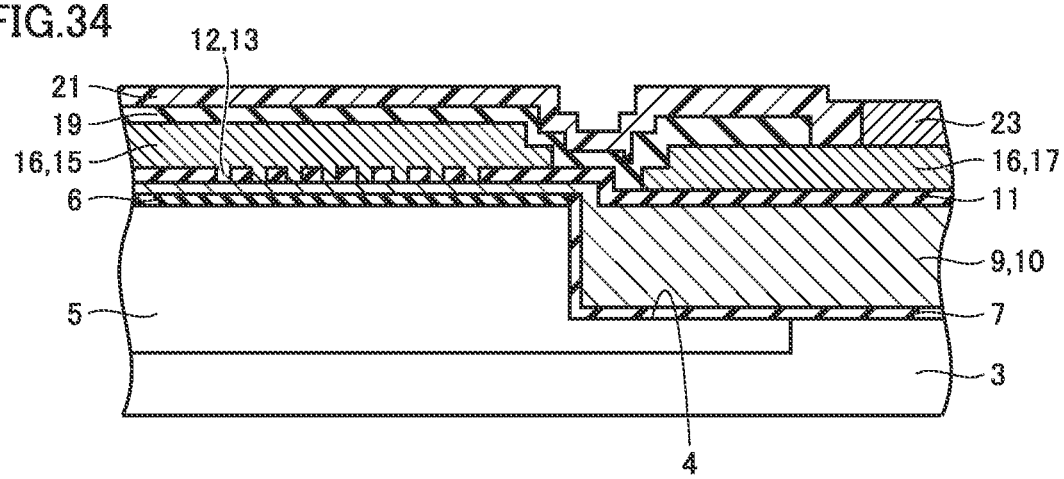
FIG. 34 is a partial sectional view showing a step performed after the step shown in FIG. 33, in the same embodiment.

Then, as shown in FIG. 33, glass coating film 19 is formed through a step similar to that shown in FIG. 10. Then, as shown in FIG. 34, polyimide film 21 is formed to cover glass coating film 19 through a step similar to that shown in FIG. 11. Then, metal film 23 is formed in contact with emitter electrode 17. Solder layer 25 is subsequently formed to cover polyimide film 21, to complete a main part of semiconductor device 1 shown in FIG. 30.

Figure 35:
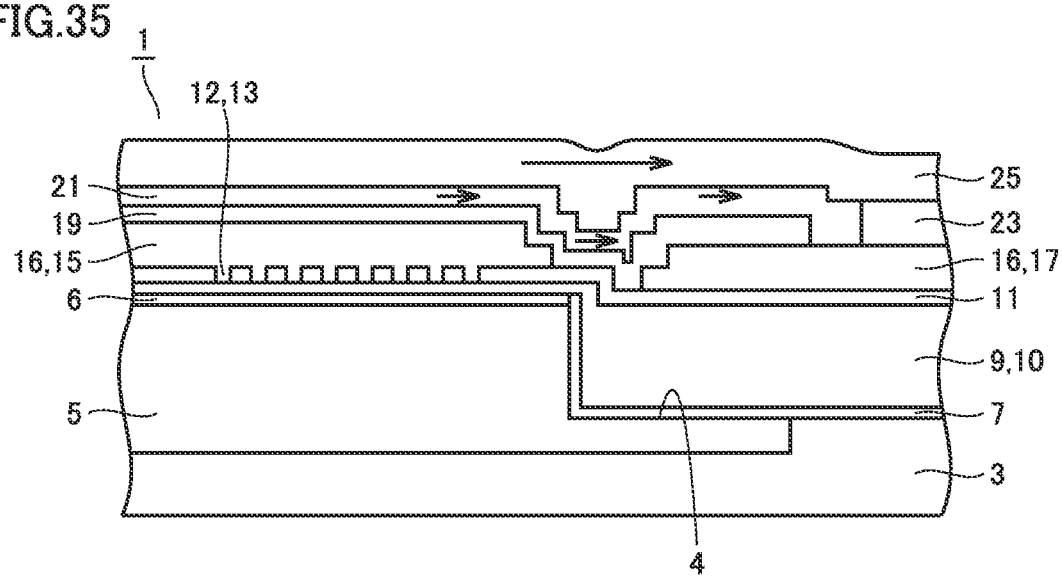
FIG. 35 is a partial sectional view illustrating stress acting on the semiconductor device, in the same embodiment.

In semiconductor device 1 described above, each of gate interconnection 15 and emitter electrode 17 is provided with the stepped inclined portion. Thus, the stress acting on polyimide film 21 with the expansion and contraction of solder layer 25 is partly released by the inclined portions of gate interconnection 15 and the like. The stress reaching gate interconnection 15 and the like is thereby weakened. As a result, as shown in FIG. 35, the sliding of gate interconnection 15 in the lateral direction can be suppressed, to prevent gate interconnection 15 from coming into contact with emitter electrode 17 to cause electrical shorting.

The above-described method of manufacturing semiconductor device 1 has described a case where aluminum film 16 having a predetermined film thickness is formed, and then two anisotropic etching processes are performed to thereby form gate interconnection 15 and emitter electrode 17 each having the stepped inclined portion. Alternatively, for example, aluminum films each having a film thickness approximately half the predetermined film thickness may be formed in two steps. In this case, an aluminum film serving as the first layer can be patterned, and then an aluminum film serving as the second layer can be formed and patterned, to thereby form stepped gate interconnection 15 and emitter electrode 17.

Fifth Embodiment

Described here is an example of a semiconductor device including a gate interconnection and an emitter electrode, where an upper surface of the emitter electrode is located lower than a lower surface of the gate interconnection.

Figure 36:
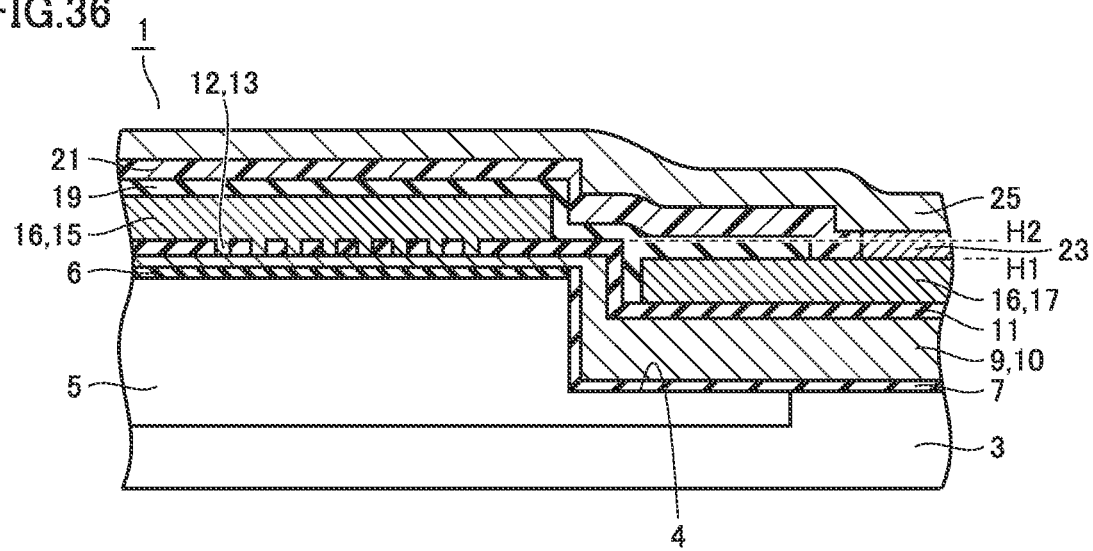
FIG. 36 is a partial sectional view of a semiconductor device according to a fifth embodiment.

As shown in FIG. 36, in semiconductor device 1, gate interconnection 15 is formed in contact with gate interlayer insulating film 11. Emitter electrode 17 is formed, at a distance from gate interconnection 15, in contact with gate interlayer insulating film 11. A position H1 of an upper surface of emitter electrode 17 is at a position lower than a position H2 of a lower surface of gate interconnection 15. Gate interconnection 15 and emitter electrode 17 are each formed of aluminum film 16, for example.

Glass coating film 19 is formed to cover gate interconnection 15 and the emitter electrode, as well as the region located between gate interconnection 15 and emitter electrode 17. Further, polyimide film 21 is formed to cover glass coating film 19. Solder layer 25 is formed to cover polyimide film 21 and the like. Since the configuration is otherwise similar to that of semiconductor device 1 shown in FIG. 2, the same components are designated by the same characters and description thereof will not be repeated unless needed.

Figure 37:
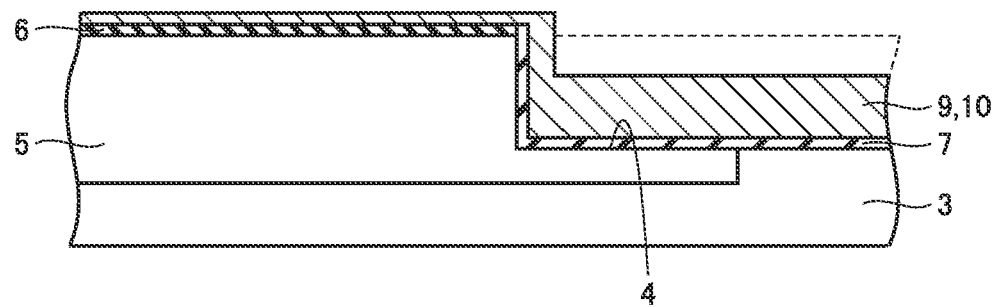
FIG. 37 is a partial sectional view showing a step of a method of manufacturing the semiconductor device, in the same embodiment.

An example of a method of manufacturing above-described semiconductor device 1 is described next. First, polysilicon film 9 (see FIG. 37) is formed to fill trench 4 (see FIG. 37) through steps similar to those shown in FIGS. 3 to 5. Then, as shown in FIG. 37, an etching process is performed on a portion of polysilicon film 9 that is located in trench 4, to thereby lower the position of an upper surface of polysilicon film 9 as compared to the position of the upper surface of the polysilicon film shown in FIG. 6 (see a dotted line).

Figure 38:
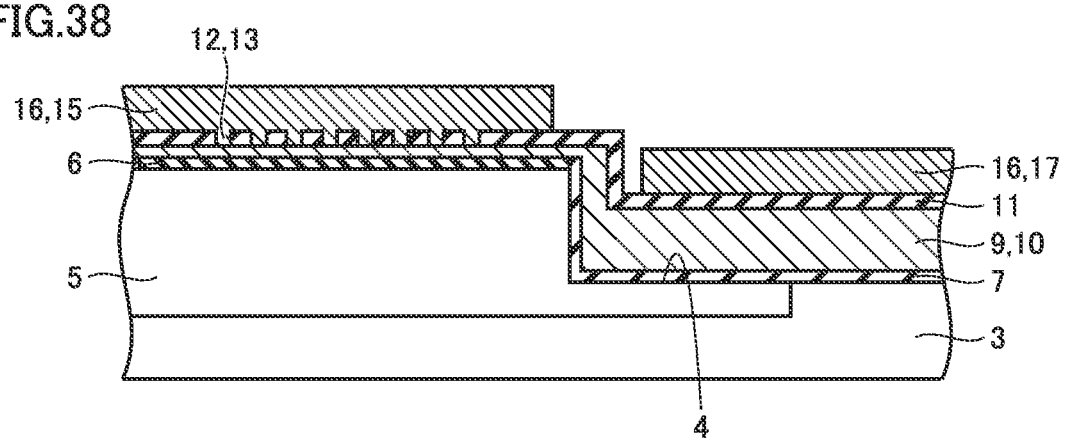
FIG. 38 is a partial sectional view showing a step performed after the step shown in FIG. 37, in the same embodiment.

Then, as shown in FIG. 38, gate interconnection 15 and emitter electrode 17 are formed through steps similar to those shown in FIGS. 7 to 9. Gate interconnection 15 and emitter electrode 17 are each formed of aluminum film 16, for example. Here, the film thickness of aluminum film 16 is set such that the upper surface of emitter electrode 17 is located lower than the lower surface of gate interconnection 15, in consideration of the position (height) of a base on which gate interconnection 15 is formed and the position (height) of a base on which emitter electrode 17 is formed.

Figure 39:
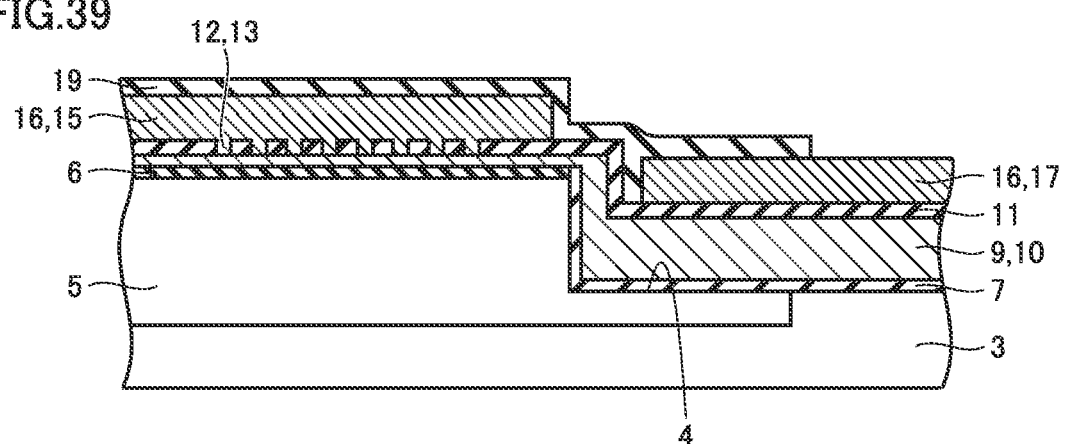
FIG. 39 is a partial sectional view showing a step performed after the step shown in FIG. 38, in the same embodiment.
Figure 40:
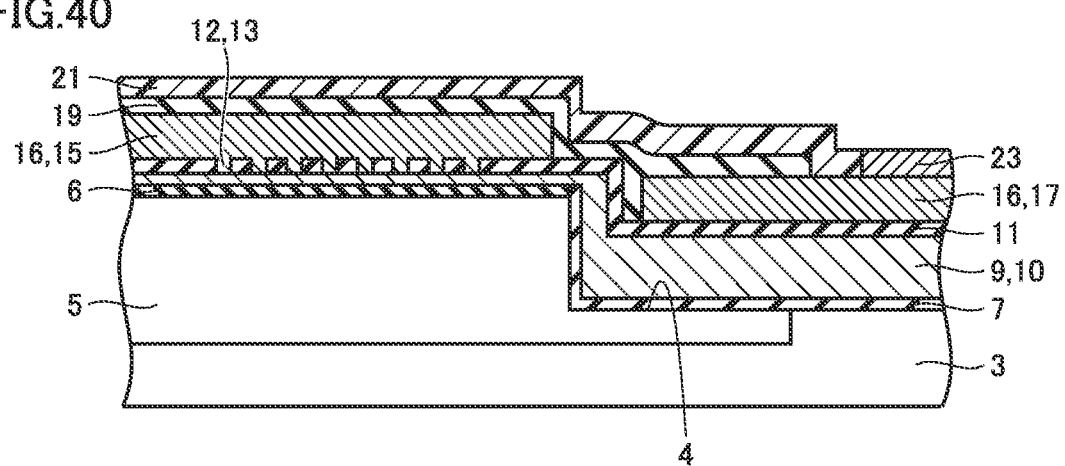
FIG. 40 is a partial sectional view showing a step performed after the step shown in FIG. 39, in the same embodiment.

Then, as shown in FIG. 39, glass coating film 19 is formed through a step similar to that shown in FIG. 10. Then, as shown in FIG. 40, polyimide film 21 is formed to cover glass coating film 19 through a step similar to that shown in FIG. 11. Then, metal film 23 is formed in contact with emitter electrode 17. Solder layer 25 is subsequently formed to cover polyimide film 21, to complete a main part of semiconductor device 1 shown in FIG. 36.

In semiconductor device 1 described above, position H1 of the upper surface of emitter electrode 17 is at a position lower than position H2 of the lower surface of gate interconnection 15. Thus, the stress acting on polyimide film 21 with the expansion and contraction of solder layer 25 reaches gate interconnection 15, but hardly reaches emitter electrode 17.

In addition, as shown in FIG. 41, even if gate interconnection 15 slides due to the stress acting on gate interconnection 15, since the upper surface of emitter electrode 17 is located lower than the lower surface of gate interconnection 15, gate interconnection 15 can be prevented from coming into contact with emitter electrode 17 to cause electrical shorting.

Sixth Embodiment

Described here is an example of a semiconductor device including a gate interconnection and an emitter electrode, where the emitter electrode and the gate interconnection each have a relatively small thickness.

As shown in FIG. 42, in semiconductor device 1, gate interconnection 15 is formed in contact with gate interlayer insulating film 11. Emitter electrode 17 is formed, at a distance from gate interconnection 15, in contact with gate interlayer insulating film 11. Gate interconnection 15 and emitter electrode 17 are each formed to have a thickness smaller than that of solder layer 25, for example.

Glass coating film 19 is formed to cover gate interconnection 15 and emitter electrode 17, as well as the region located between gate interconnection 15 and emitter electrode 17. Further, polyimide film 21 is formed to cover glass coating film 19. Solder layer 25 is formed to cover polyimide film 21 and the like. Since the configuration is otherwise similar to that of semiconductor device 1 shown in FIG. 2, the same components are designated by the same characters and description thereof will not be repeated unless needed.

Figure 43:
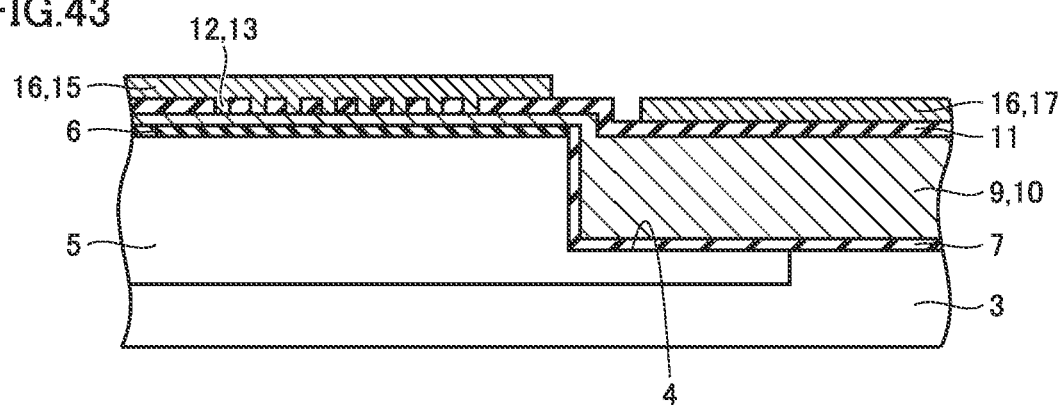
FIG. 43 is a partial sectional view showing a step of a method of manufacturing the semiconductor device, in the same embodiment.

An example of a method of manufacturing above-described semiconductor device 1 is described next. First, as shown in FIG. 43, aluminum film 16 is patterned to form gate interconnection 15 and emitter electrode 17 through steps similar to those shown in FIGS. 3 to 9. Here, aluminum film 16 is formed to have a thickness smaller than that of solder layer 25, for example.

Figure 44:
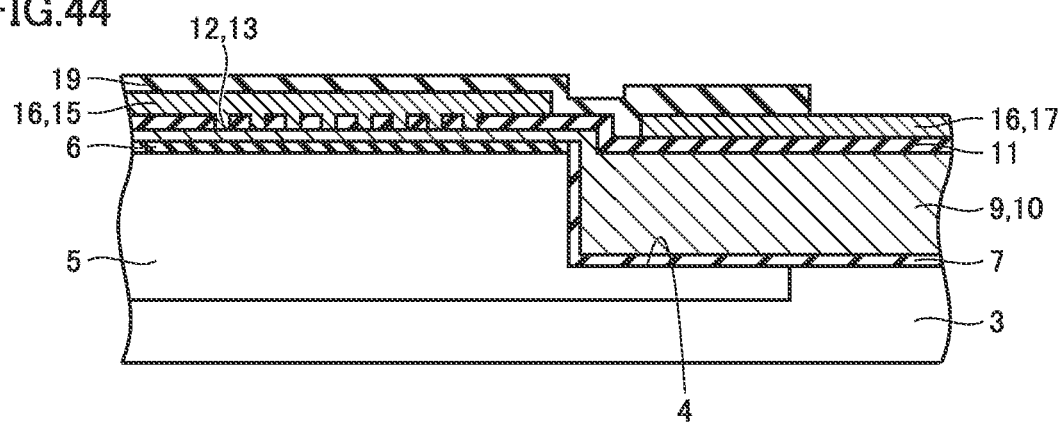
FIG. 44 is a partial sectional view showing a step performed after the step shown in FIG. 43, in the same embodiment.
Figure 45:
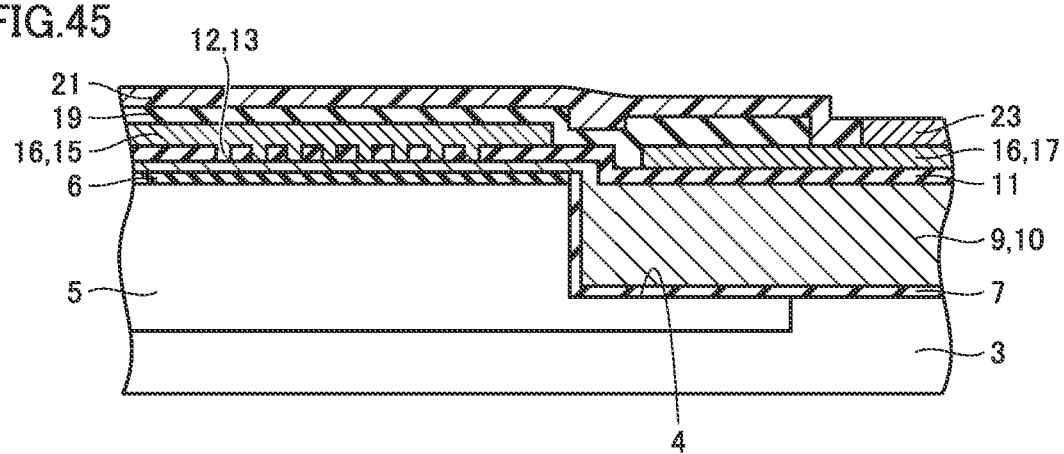
FIG. 45 is a partial sectional view showing a step performed after the step shown in FIG. 44, in the same embodiment.

Then, as shown in FIG. 44, glass coating film 19 is formed through a step similar to that shown in FIG. 10. Then, as shown in FIG. 45, polyimide film 21 is formed to cover glass coating film 19 through a step similar to that shown in FIG. 11. Then, metal film 23 is formed in contact with emitter electrode 17. Solder layer 25 is subsequently formed to cover polyimide film 21, to complete a main part of semiconductor device 1 shown in FIG. 42.

Figure 46:
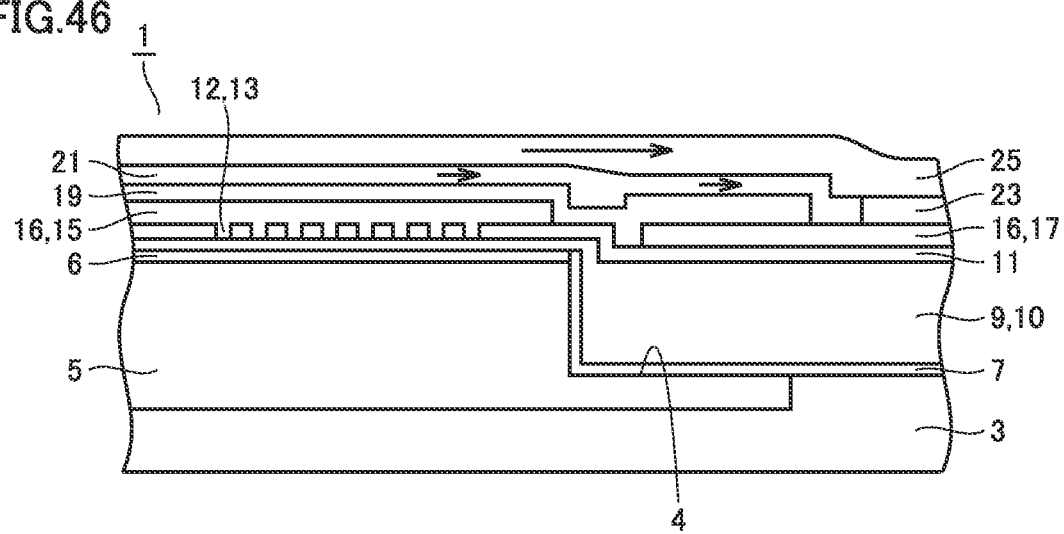
FIG. 46 is a partial sectional view illustrating stress acting on the semiconductor device, in the same embodiment.

In semiconductor device 1 described above, gate interconnection 15 and emitter electrode 17 are each formed to have a relatively small film thickness. Specifically, gate interconnection 15 and emitter electrode 17 are each formed to have a film thickness smaller than that of solder layer 25, for example. Thus, the stress acting on gate interconnection 15 and the like with the expansion and contraction of solder layer 25 is reduced as compared to when the film thickness is relatively great, whereby the stress acting on gate interconnection 15 and the like is relaxed. As a result, as shown in FIG. 46, the sliding of gate interconnection 15 in the lateral direction can be suppressed, to prevent gate interconnection 15 from coming into contact with emitter electrode 17 to cause electrical shorting.

It should be noted that semiconductor devices 1 described in the respective embodiments can be combined in various ways as needed. For example, although the second to sixth embodiments have described a case where gate interconnection 15 and emitter electrode 17 are each formed of aluminum film 16, a metal film having a predetermined Young's modulus such as tungsten film 14 described in the first embodiment may be applied.

Although gate interconnection 15 and emitter electrode 17 have been described by way of example in the semiconductor devices in the above respective embodiments, the structure described in each embodiment can be applied to interconnections other than gate interconnection 15 and electrodes other than emitter electrode 17. By applying such a structure, electrical shorting between an interconnection and an electrode, electrical shorting between interconnections, or electrical shorting between electrodes can be suppressed.

Further, although an IGBT has been cited as an example of the semiconductor element, the structure described in each embodiment can be applied to an electrode, an interconnection and the like of a semiconductor element such as a MOFEST or a SiC-MOS, in addition to the IGBT.

The embodiments disclosed herein are illustrative and non-restrictive. The scope of the present invention is defined by the terms of the claims, rather than the description above, and is intended to include any modifications within the scope and meaning equivalent to the terms of the claims.

INDUSTRIAL APPLICABILITY

The present invention is effectively utilized for a power semiconductor device having an interconnection and an electrode.

REFERENCE SIGNS LIST 1 semiconductor device; 3 semiconductor substrate; 4 trench; 5 P layer; 6 silicon oxide film; 7 gate insulating film; 9 polysilicon film; 10 gate electrode; 11 gate interlayer insulating film; 12 contact hole; 13 contact; 14 tungsten film; 15 gate interconnection; 16 aluminum film; 17 emitter electrode; 18 conductive film; 18a embedded electrode; 19 glass coating film; 21 polyimide film; 23 metal film; 25 solder layer; 31, 32 photoresist pattern; H1, H2 position.

The invention claimed is:

1. A semiconductor device comprising:
a semiconductor substrate;
an insulating film formed to cover the semiconductor substrate;
a first electric conductor formed on the insulating film;
a second electric conductor formed on the insulating film at a distance from the first electric conductor;
an embedded body formed to fill space between the first electric conductor and the second electric conductor;
a protective film formed to cover the first electric conductor, the second electric conductor and the embedded body;
a solder layer formed to cover the protective film; and
a glass coating film covering an upper surface of each of the first electric conductor and the second electric conductor,
a position of an upper surface of the embedded body being matched to a position of an upper surface of the glass coating film, and
the first electrical conductor is electrically isolated from the second electrical conductor.

2. The semiconductor device according to claim 1, wherein
the embedded body is made of a material selected from the group consisting of aluminum (Al), tungsten (W) and titanium (Ti).

3. The semiconductor device according to claim 1, wherein
the protective film includes a semi-insulating protective film in contact with the solder layer.

4. The semiconductor device according to claim 1, wherein
the first electric conductor includes an interconnection, and
the second electric conductor includes an electrode.

5. The semiconductor device according to claim 1, wherein
each of the first electric conductor, the second electric conductor, and the embedded body is directly on an upper surface of the insulating film.

6. The semiconductor device according to claim 1, wherein
the embedded body is a dummy electrode.

7. The semiconductor device according to claim 1, wherein
the embedded body is positioned in a recess separating the first electric conductor from the second electric conductor.

8. The semiconductor device according to claim 7, wherein
the protective film directly contacts an upper surface of the embedded body and is not provided in the recess separating the first electric conductor from the second electric conductor.

9. The semiconductor device according to claim 1, wherein
the first electrical conductor, the second electrical conductor, and the embedded body are electrically isolated from each other.

10. The semiconductor device according to claim 1, wherein
the position of an upper surface of the embedded body being matched to a position of an upper surface of the glass coating film is such that a vertical position of the upper surface of the embedded body substantially coincides with a vertical position of a portion of the upper surface of the glass coating film.

* * * * *